(12) United States Patent
Kameyama et al.

(10) Patent No.: US 9,876,608 B2
(45) Date of Patent: Jan. 23, 2018

(54) ENCODING APPARATUS AND ENCODING METHOD

(71) Applicant: FUJITSU LIMITED, Kawasaki-shi, Kanagawa (JP)

(72) Inventors: Hiroaki Kameyama, Kawasaki (JP); Shinichi Sazawa, Atsugi (JP); Hiroyuki Higuchi, Hino (JP)

(73) Assignee: FUJITSU LIMITED, Kawasaki (JP)

( * ) Notice: Subject to any disclaimer, the term of this patent is extended or adjusted under 35 U.S.C. 154(b) by 62 days.

(21) Appl. No.: 15/080,760

(22) Filed: Mar. 25, 2016

(65) Prior Publication Data

US 2016/0211942 A1 Jul. 21, 2016

Related U.S. Application Data

(63) Continuation of application No. PCT/JP2013/076907, filed on Oct. 3, 2013.

(51) Int. Cl.
*H03M 13/00* (2006.01)
*H04L 1/00* (2006.01)
(Continued)

(52) U.S. Cl.
CPC .......... *H04L 1/0041* (2013.01); *H03M 13/05* (2013.01); *H03M 13/2906* (2013.01);
(Continued)

(58) Field of Classification Search
None
See application file for complete search history.

(56) References Cited

U.S. PATENT DOCUMENTS

| | | |
|---|---|---|
| 6,934,308 B1 | 8/2005 | Yonenaga et al. |
| 8,347,169 B1 | 1/2013 | Acikel |

(Continued)

FOREIGN PATENT DOCUMENTS

| | | |
|---|---|---|
| JP | 2000-224244 | 8/2000 |
| JP | 2004-274709 | 9/2004 |

(Continued)

OTHER PUBLICATIONS

Hiroaki Kameyama et al., "Erasure Codes with Small Overhead Factor and their data transfer systems", The Institute of Electronics, Information and Communication Engineers, IEICE Technical Report CS2009-41 (Sep. 2009), vol. 109, No. 190, pp. 47-52 (7 pages).

(Continued)

*Primary Examiner* — Daniel McMahon
(74) *Attorney, Agent, or Firm* — Fujitsu Patent Center

(57) ABSTRACT

In an encoding method, data segments and encoding information which indicates encoding patterns each representing a set of data segments used for a predetermined encoding calculation are acquired. An encoded data piece is generated by performing the predetermined encoding calculation based on each encoding pattern, and is stored in the memory. A first encoding pattern for generating the encoded data piece is compared to a second encoding pattern for a next encoding calculation, and the next encoding calculation is performed by using the encoded data piece corresponding to the first encoding pattern when at least a part of the second pattern is common with the first encoding pattern.

3 Claims, 28 Drawing Sheets

(51) Int. Cl.
*H03M 13/29* (2006.01)
*H03M 13/05* (2006.01)

(52) U.S. Cl.
CPC ..... *H03M 13/611* (2013.01); *H03M 13/6502* (2013.01); *H03M 13/6572* (2013.01); *H03M 13/6575* (2013.01)

(56) References Cited

U.S. PATENT DOCUMENTS

| | | | | |
|---|---|---|---|---|
| 8,392,805 | B2* | 3/2013 | Wylie | G06F 11/1076 |
| | | | | 714/766 |
| 9,003,257 | B1* | 4/2015 | Mahdi | H03M 13/1102 |
| | | | | 714/752 |
| 9,426,517 | B2* | 8/2016 | Kozat | G06F 11/1096 |
| 2004/0064776 | A1 | 4/2004 | Yedidia et al. | |
| 2006/0048036 | A1 | 3/2006 | Miura et al. | |
| 2007/0220404 | A1 | 9/2007 | Terui et al. | |
| 2008/0201581 | A1 | 8/2008 | Kameyama et al. | |
| 2009/0164762 | A1 | 6/2009 | Huang et al. | |

FOREIGN PATENT DOCUMENTS

| | | |
|---|---|---|
| JP | 2006-067072 | 3/2006 |
| JP | 2007-258796 | 10/2007 |
| JP | 4318317 | 8/2009 |
| JP | 4476898 | 6/2010 |
| JP | 5076539 | 11/2012 |

OTHER PUBLICATIONS

International Search Report and Written Opinion of the International Searching Authority (Form PCT/ISA/210, Form PCT/ISA/237), mailed in connection with PCT/JP2013/076907 dated Dec. 10, 2013 (10 pages).
EESR—The Extended European Search Report dated Sep. 7, 2016 for corresponding European Application No. 13895088.6.
**US20040064776 cited in the EESR was previously submitted in the IDS filed on Mar. 25, 2016.
JPOA—Office Action dated May 30, 2017 for corresponding Japanese Application No. 2015-540315, with full machine translation.
**All references cited in the JPOA were previously submitted in the IDS filed on Mar. 25, 2016.

* cited by examiner

EXAMPLE OF SYSTEM

HAMMING DISTANCE TABLE

|  |  | r1 | r2 | r3 | r4 | r5 | r6 |
|---|---|---|---|---|---|---|---|
|  |  | 1 0 1 0 | 0 1 1 0 | 1 0 0 1 | 0 1 0 1 | 0 1 1 1 | 1 1 1 0 |
| r1 | 1 0 1 0 | 0 |  |  |  |  |  |
| r2 | 0 1 1 0 | 2 | 0 |  |  |  |  |
| r3 | 1 0 0 1 | 2 | 4 | 0 |  |  |  |
| r4 | 0 1 0 1 | 4 | 2 | 2 | 0 |  |  |
| r5 | 0 1 1 1 | 3 | 1 | 3 | 1 | 0 |  |
| r6 | 1 1 1 0 | 1 | 1 | 3 | 3 | 2 | 0 |

H61   H52

ENCODING MATRIX

EXAMPLE OF FUNCTION f(z1, z2, z3)

| INPUT VALUES | | | OUTPUT VALUE OF FUNCTION f |
|---|---|---|---|
| z1 | z2 | z3 | |
| 0 | 0 | 0 | 0 |
| 0 | 0 | 1 | 1 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

FIG. 15

SELECTION OF MINIMUM
HAMMING DISTANCES

| HAMMING DISTANCE TABLE (AFTER POST-PROCESSING) | r1 | r2 | r3 | r4 | r5 | r6 |
|---|---|---|---|---|---|---|
| | 1 0 1 0 | 0 1 1 0 | 1 0 0 1 | 0 1 0 1 | 0 1 1 1 | 1 1 1 0 |
| r3   1 0 0 1 | 1 0 1 | 0 1 1 | 1 0 1 | | | |

ENCODING APPARATUS AND ENCODING METHOD

CROSS-REFERENCE TO RELATED APPLICATION

This application is a continuation application of International Application PCT/JP2013/076907 filed on Oct. 3, 2013 which designated the U.S., the entire contents of which are incorporated herein by reference.

FIELD

The embodiments discussed herein are related to a program, an encoding apparatus, and an encoding method.

BACKGROUND

Various types of networks, such as the Internet, local area networks (LAN), wide area networks (WAN), and mobile telephone networks, are used in data communication. It is often the case in such data communication using a network that a transport layer protocol is used to appropriately pass data on to an application layer while controlling end-to-end communication between a transmitting device and a receiving device. Examples of the transport layer protocol include the connection-oriented Transmission Control Protocol (TCP) and the connectionless User Datagram Protocol (UDP).

TCP defines a mechanism for returning an ACK (ACKnowledgement) response to the transmitting device when the receiving device has received a data packet normally in order to confirm the receipt of the data packet by the receiving device. In addition, TCP defines a mechanism for resending a data packet when the transmitting device has failed to receive an expected ACK within a certain amount of time after transmitting the data packet. TCP with such mechanisms is a high-integrity transport-layer protocol.

On the other hand, because not providing receipt confirmation using an ACK, UDP is typically used for data communication providing high-speed data transmission and giving greater importance to the communication throughput and real-time services. In addition, UDP is able to independently implement a function to improve the integrity in upper-layer protocols. For example, UDP may be combined with functions such as Forward Error Correction (FEC) coding and retransmission control. Implementation of such combinations enables high-speed and high-integrity data transmission.

Examples of error correction codes include a Reed-Solomon code and a Low-Density Parity-check Code (LDPC). In addition, a Random Parity Stream (RPS) code has lately been proposed, which is a sophisticated error correction code generated by using exclusive OR (XOR) calculation. Furthermore, a proposed technique is directed to a data transmission method of realizing high-speed data transmission by combining UDP with RPS coding. According to the data transmission method, the transmitting side performs XOR operations on data segments created by dividing data to be transmitted, to thereby generate encoded data pieces, and the receiving side reconstructs the transmitted data from the encoded data pieces using XOR operations.

See, for example, Japanese Patent No. 4318317.

According to the above-described data transmission system, the probability that the receiving side is able to reconstruct the transmitted data increases with a larger number of data segments created by dividing the data to be transmitted. That is, an increased number of data segments enhances the data integrity. On the other hand, the increased number of data segments leads to an increased number of XOR operations performed to generate encoded data pieces. In an encoding method where each encoded data piece is generated by performing a logical operation on a combination of data segments, as in the case of this example, generating the same encoded data pieces with fewer logical operations enables a reduction in operation load associated with encoding, without sacrificing the integrity.

SUMMARY

According to one aspect, there is provided an encoding method including: acquiring, by a processor, a plurality of data segments, which are created by dividing transmission data, and encoding information including a plurality of encoding patterns each representing a combination of the data segments from a memory; generating, by the processor, with respect to each of the encoding patterns included in the encoding information, an encoded data piece by performing a set operation on the combination of the data segments corresponding to the encoding pattern, and storing the encoded data piece in the memory; comparing, by the processor, a first pattern, which is the encoding pattern corresponding to the encoded data piece stored in the memory, to a second pattern, which is one of the encoding patterns corresponding to targets of the operation; and performing, by the processor, in the generating, the operation using the encoded data piece corresponding to the first pattern when a part of the combination of the data segments represented by the second pattern includes the combination of the data segments represented by the first pattern.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 15 is a first diagram for explaining a BDD representation according to a modification of the second embodiment;

FIG. 25 is a fifth diagram illustrating the method for selecting each minimum Hamming distance according to the modification of the second embodiment;

DESCRIPTION OF EMBODIMENTS

Figure 1:
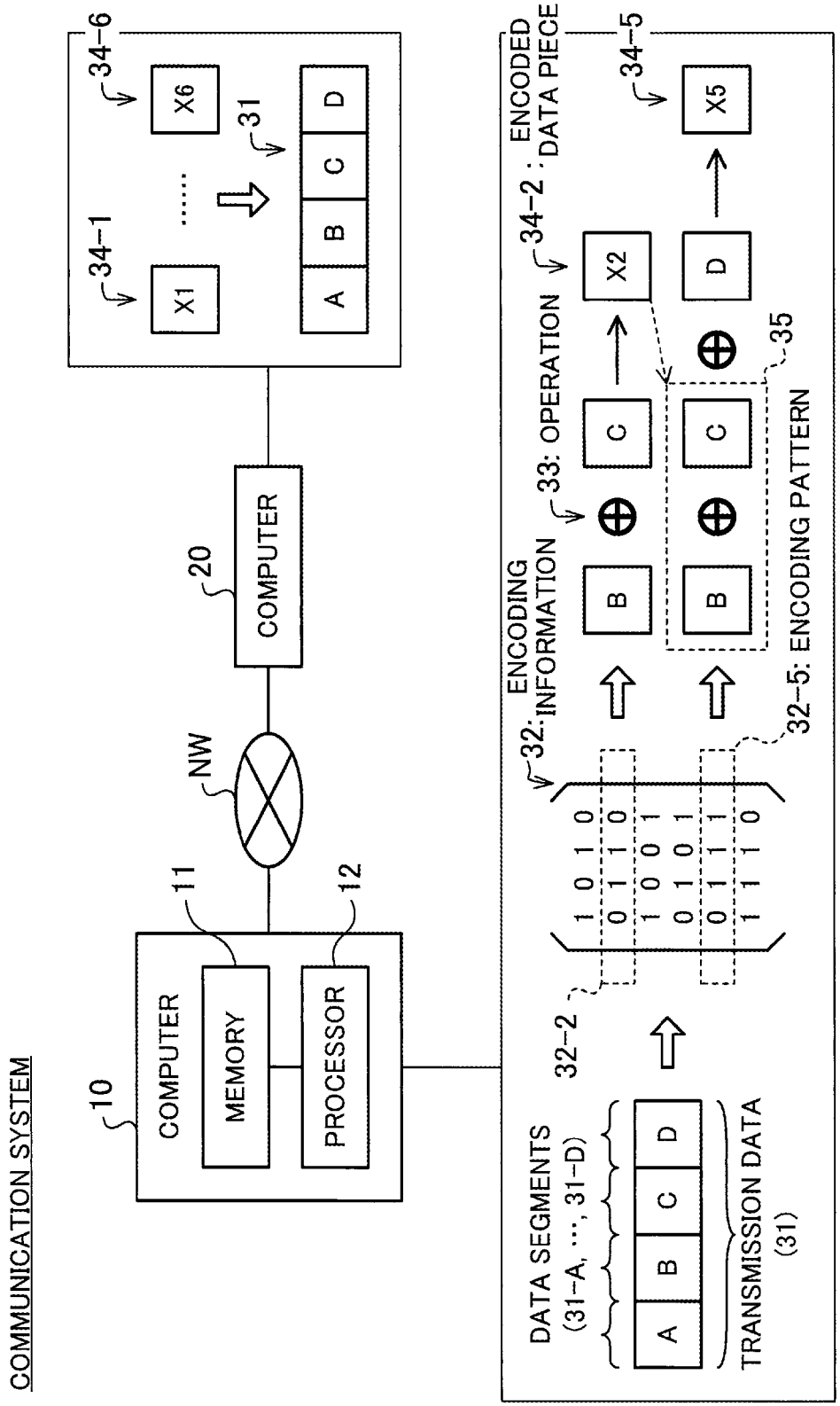
FIG. 1 illustrates an example of a communication system according to a first embodiment.

Several embodiments will be described below with reference to the accompanying drawings. In the following description and the accompanying drawings, like reference numerals refer to like elements having substantially the same functions, and a repeated description thereof may be omitted.

1. First Embodiment

A first embodiment is described next with reference to FIG. 1. FIG. 1 illustrates an example of a communication system according to the first embodiment. Note that the communication system of FIG. 1 is merely an example, and the application range of the technique according to the first embodiment is not limited to the illustrated example.

As illustrated in FIG. 1, the communication system of the first embodiment includes computers 10 and 20. The computer 10 is connected to the computer 20 via a network NW. The computer 10 includes memory 11 and a processor 12.

The memory 11 is, for example, a volatile storage device such as random access memory (RAM) or a non-volatile storage device such as a hard disk drive (HDD) or flash memory. The processor 12 is, for example, a central processing unit (CPU) or a digital signal processor (DSP). Note however that the processor 12 may be an electronic circuit, such as an application specific integrated circuit (ASIC) or a field programmable gate array (FPGA). The processor 12 performs a procedure according to a program stored in the memory 11 or a different storage device.

The memory 11 stores therein a plurality of data segments 31-A, . . . , and 31-D, which are created by dividing transmission data 31, and encoding information 32 including a plurality of encoding patterns 32-1, . . . , and 32-6 each representing a combination of the data segments. Note that, according to the example of FIG. 1, the data segments 31-A, . . . , and 31-D are represented by blocks denoted by "A", "B", "C", and "D", respectively. The transmission data 31 is an example of data to be transmitted from the computer 10 to the computer 20 via the network NW. The data segments 31-A, . . . , and 31-D are examples of data segments created by dividing the transmission data 31 by a predetermined data size.

The encoding information 32 includes the encoding patterns 32-1, . . . , and 32-6. Each of the encoding patterns 32-1, . . . , and 32-6 indicates a combination of the data segments 31-A, . . . , and 31-D. In addition, each of the encoding patterns 32-1, . . . , and 32-6 is, for example, represented by a bit string. In this case, the encoding information 32 is represented by a matrix of bit values with the bit string of the encoding pattern 32-1 in the first row, . . . , and the bit string of the encoding pattern 32-6 in the sixth row, as illustrated in FIG. 1. Further, the encoding patterns 32-1, . . . , and 32-6 correspond to encoded data pieces 34-1, . . . , and 34-6, respectively, and are individually used to calculate the corresponding encoded data pieces. Note that, in the example of FIG. 1, the encoded data pieces 34-1, . . . , and 34-6 are represented by blocks denoted by "X1", . . . , and "X6", respectively.

With respect to each of the encoding patterns 32-1, . . . , and 32-6 included in the encoding information 32, the processor 12 performs a set operation 33 on a plurality of data segments corresponding to the encoding pattern, to thereby generate each of the corresponding encoded data pieces 34-1, . . . , and 34-6. In addition, the processor 12 stores the encoded data pieces 34-1, . . . , and 34-6 in the memory 11.

How to generate the encoded data pieces 34-2 and 34-5 from the encoding patterns 32-2 and 32-5 is described next as an example.

In the example of FIG. 1, the bit string of the encoding pattern 32-2 is "0110". The processor 12 selects data segments each corresponding to a bit location with the bit value being 1 (in this case, the data segments 31-B and 31-C). Then, the processor 12 performs the predetermined operation 33 on the data segments 31-B and 31-C to thereby generate the encoded data piece 34-2. The operation 33 is, for example, a logical operation such as an exclusive OR (hereinafter sometimes referred to as "XOR") operation. The processor 12 stores the encoded data piece 34-2 in the memory 11.

Also in the example of FIG. 1, the bit string of the encoding pattern 32-5 is "0111". The processor 12 selects data segments each corresponding to a bit location with the bit value being 1 (in this case, the data segments 31-B, 31-C, and 31-D). Then, the processor 12 performs the predetermined operation 33 on the data segments 31-B, 31-C, and 31-D to thereby generate the encoded data piece 34-5. In this regard, the processor 12 uses the encoded data piece 34-2 stored in the memory 11 to generate the encoded data piece 34-5. How to use the encoded data piece 34-2 is as follows.

The processor 12 compares a first pattern which is the encoding pattern 32-2 corresponding to the encoded data piece 34-2 stored in the memory 11, with a second pattern which is the encoding pattern 32-5 corresponding to targets of the operation 33. Then, the processor 12 determines whether a part 35 of the combination of data segments represented by the second pattern includes the combination of data segments represented by the first pattern. The determination is made, for example, by comparing the encoding patterns 32-2 and 32-5 included in the encoding information 32.

According to the example of FIG. 1, the data segment combination of the first pattern is made up of the data segments 31-B and 31-C. The data segment combination of the second pattern is made up of the data segments 31-B, 31-C, and 31-D. In this case, the part 35 of the data segment combination of the second pattern matches the data segment combination of the first pattern (i.e., the data segments 31-B and 31-C). Therefore, the processor 12 performs the operation 33 using the encoded data piece 34-2 corresponding to the first pattern. According to the example of FIG. 1, the processor 12 performs the operation 33 on the encoded data piece 34-2 and the data segment 31-D to thereby generate the encoded data piece 34-5.

Performing the operation 33 using an already obtained encoded data piece, as described above, enables a reduction in operation load associated with performing the operation 33.

The encoded data pieces 34-1, . . . , and 34-6 are transmitted to the computer 20 via the network NW. The computer 20 then reconstructs the transmission data 31 using the received encoded data pieces 34-1, . . . , and 34-6. As described above, each of the encoded data pieces 34-1, . . . , and 34-6 is generated using a combination of the data segments 31-A, . . . , and 31-D. In addition, the encoded data pieces 34-1, . . . , and 34-6 have redundancy. Therefore, even if some of the encoded data pieces 34-1, . . . , and 34-6 are lost, the computer 20 is able to reconstruct the data segments 31-A, . . . , and 31-D based on the encoding information 32 with high probability.

The first embodiment has been described thus far.

2. Second Embodiment

Next described is a second embodiment. The second embodiment is directed to a technique for reducing operation processing load associated with encoding target data with the assumption of transmitting and receiving the target data based on RPS encoding.

2-1. System

Figure 2:
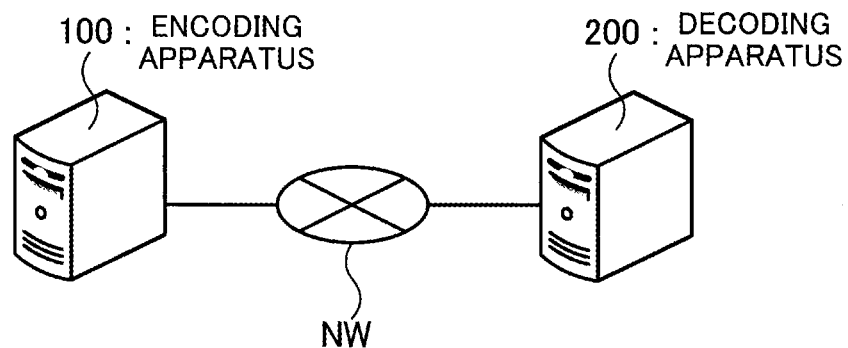
FIG. 2 illustrates an example of a system according to a second embodiment.

First, a system according to the second embodiment is described with reference to FIG. 2. FIG. 2 illustrates an example of the system according to the second embodiment.

Note that the application range of the technique according to the second embodiment is not limited to the case described herein, and the technique may be applied to a system made up of types of apparatuses different from those in the system illustrated in FIG. 2. For example, apparatuses like servers are depicted in FIG. 2; however, the technique may be applied to a system including terminals such as mobile phones and smartphones, or communication apparatuses such as relay stations. Note however that the following gives a description based on the system illustrated in FIG. 2 for the purpose of illustration.

As illustrated in FIG. 2, the system of the second embodiment includes an encoding apparatus 100 and a decoding apparatus 200. The encoding apparatus 100 is connected to the decoding apparatus 200 via the network NW. Examples of such an applicable network NW include various types of networks, such as a LAN, a WAN, a mobile telephone network, a satellite communication network, an optical fiber network, and a combination of these networks.

The encoding apparatus 100 transmits data (hereinafter referred to as "target data") to the decoding apparatus 200 via the network NW. At this time, the encoding apparatus 100 generates a plurality of data segments by dividing the target data. Further, the encoding apparatus 100 performs encoding processing based on the data segments to generate a plurality of encoded data pieces. Then, the encoding apparatus 100 transmits the generated encoded data pieces to the decoding apparatus 200. The decoding apparatus 200 performs decoding processing based on the received encoded data pieces to reconstruct the data segments. Then, the decoding apparatus 200 binds the reconstructed data segments to reconstruct the target data.

2-2. RPS Encoding

Figure 3:
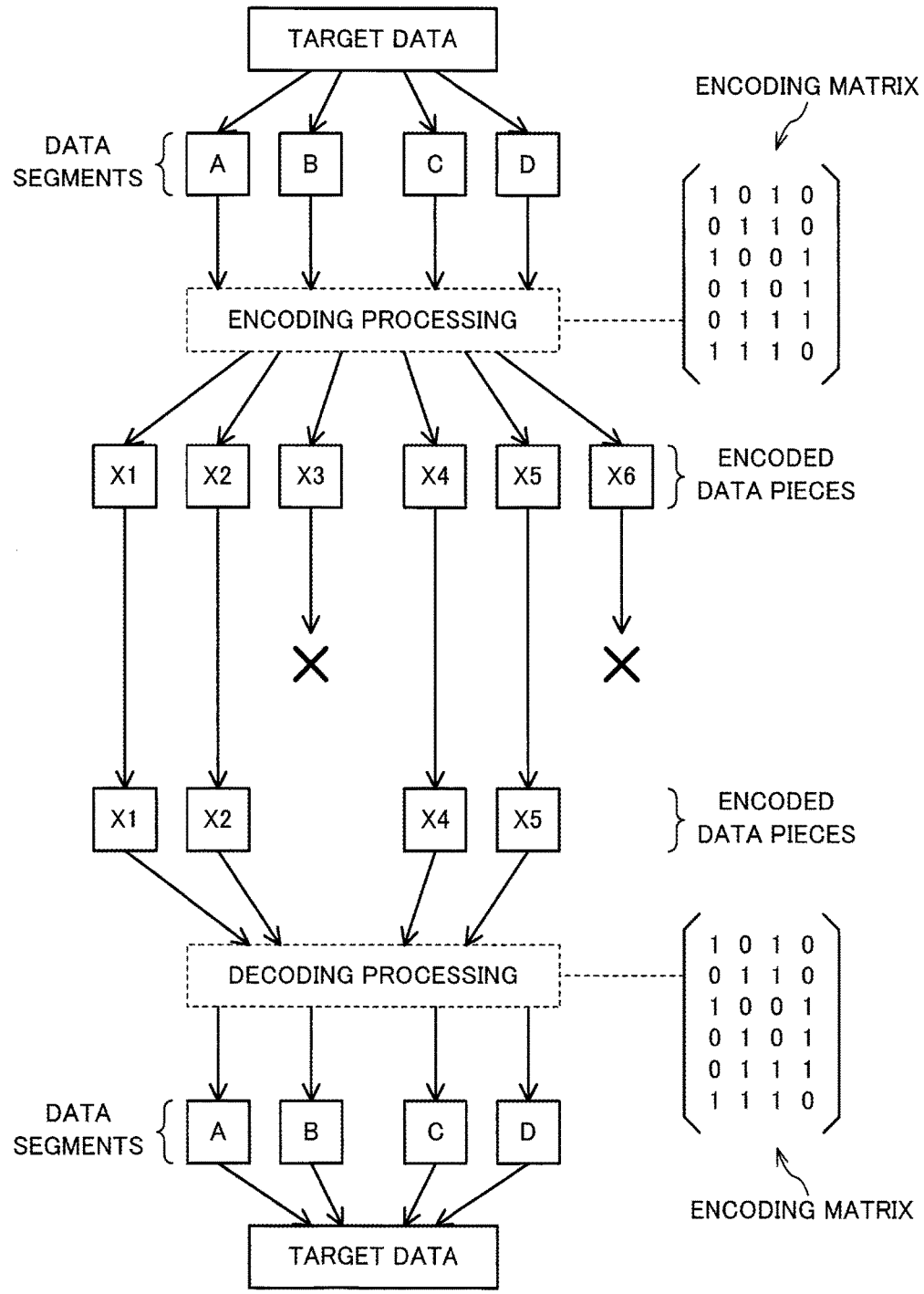
FIG. 3 is a first diagram illustrating RPS encoding.
Figure 4:
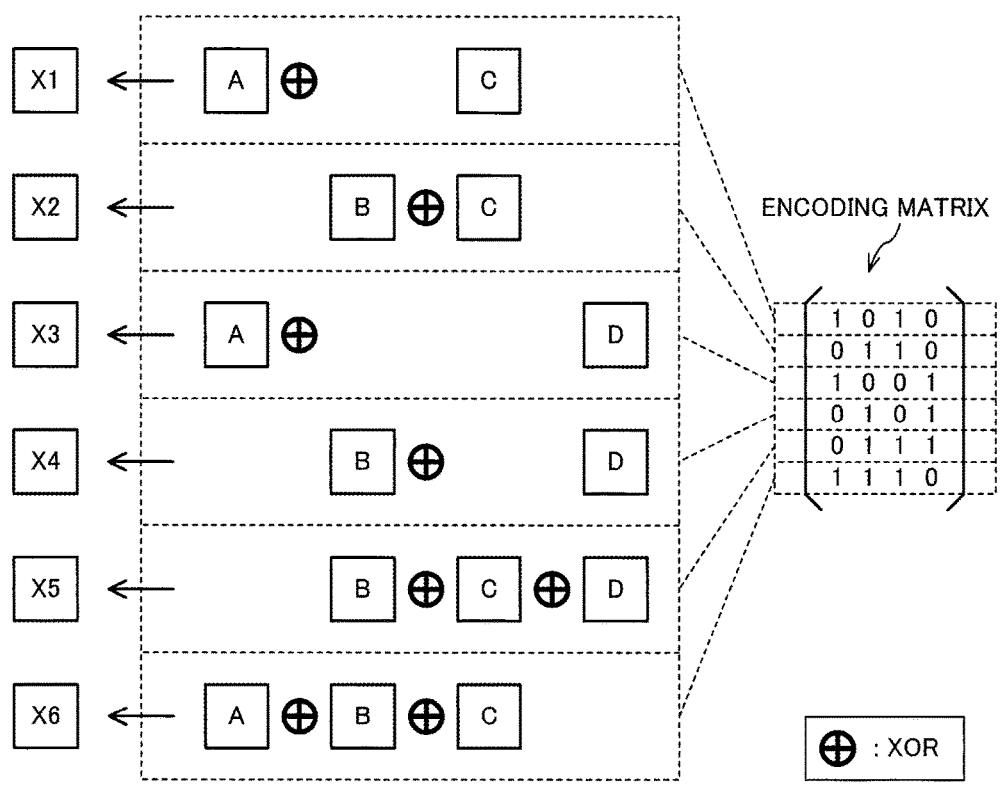
FIG. 4 is a second diagram illustrating the RPS encoding.
Figure 5:
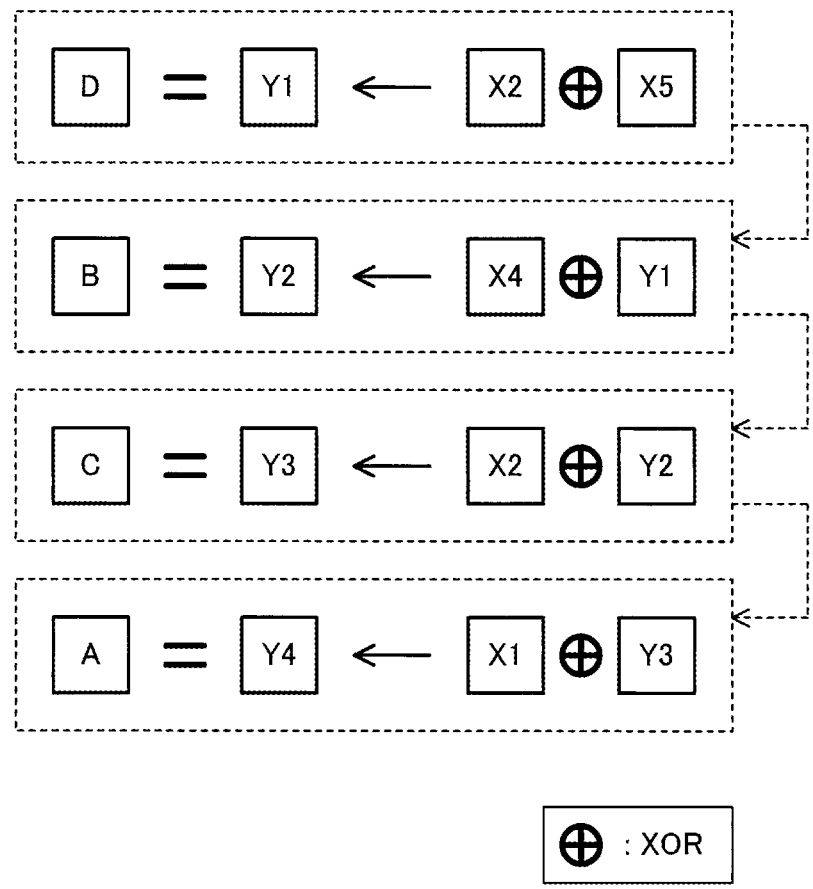
FIG. 5 is a third diagram illustrating the RPS encoding.

In the system of the second embodiment, the encoding apparatus 100 performs encoding processing based on RPS encoding and the decoding apparatus 200 performs decoding processing based on the RPS encoding. Next described is the RPS encoding with reference to FIGS. 3 to 5. FIG. 3 is a first diagram illustrating the RPS encoding. FIG. 4 is a second diagram illustrating the RPS encoding. FIG. 5 is a third diagram illustrating the RPS encoding.

As illustrated in FIG. 3, according to the RPS encoding, the target data is divided into a plurality of data segments on the transmitting side. The target data is divided, for example, into data segments of the same data size. Assume, for the purpose of illustration, that the target data is divided into data segments A, B, C, and D. Then, encoding processing takes place using the data segments A, B, C, and D. The encoding processing employs an encoding matrix. Each row of the encoding matrix represents a combination of the data segments A, B, C, and D.

For example, the bit string in the first row of the encoding matrix of FIG. 3 is 1010. In this example, first, second, third, and forth columns of the encoding matrix are associated with the data segments A, B, C, and D, respectively. For each row, data segments each corresponding to a bit with a value of 1 are data segments to be combined. Therefore, the bit string 1010 represents a combination of the data segments A and C.

In like fashion, a bit string 0110 in the second row represents a combination of the data segments B and C. The same applies to the third to sixth rows. Note that the number of rows and the combination patterns in the encoding matrix may be set in advance, and are not limited to the example illustrated in FIG. 3.

In the encoding processing illustrated in FIG. 3, six encoded data pieces X1, X2, . . . , and X6 are generated from the data segments A, B, C, and D. The encoded data piece X1 corresponds to the first row of the encoding matrix. The encoded data piece X2 corresponds to the second row of the encoding matrix.

In like fashion, the encoded data pieces X3, . . . , and X6 correspond to the third row, . . . , and the sixth row, respectively, of the encoding matrix. The encoded data pieces X1, X2, . . . , and X6 are transmitted from the transmitting side to the receiving side. In this regard, it is sometimes the case that some of the encoded data pieces X1, X2, . . . , and X6 are not received normally due to, for example, loss in the transmission line. FIG. 3 illustrates a case where the encoded data pieces X3 and X6 have failed to be received normally.

Each of the encoded data pieces X1, X2, . . . , and X6 is generated based on a combination of the data segments A, B, C, and D, as described above. The encoded data pieces X1, X2, . . . , and X6 individually have redundancy. Therefore, even if some of the encoded data pieces X1, X2, . . . , and X6 are not received normally, the data segments A, B, C, and D may be reconstructed with high probability.

The decoding processing employs the same information as the encoding matrix used in the encoding processing on the transmitting side. In the example of FIG. 3, the data segments A, B, C, and D are reconstructed by the decoding processing and the target data is then reconstructed by binding the data segments A, B, C, and D. Thus, the RPS encoding involves division of the target data, encoding processing, decoding processing, binding of the data segments, and the like.

Next, the encoding processing based on the RPS encoding is further described with reference to FIG. 4. Note that elements and parts associated with the encoding processing illustrated in FIG. 4 correspond to those in FIG. 3.

As illustrated in FIG. 4, in the RPS encoding, each encoded data piece is generated by performing an exclusive OR (XOR) operation on data segments. For example, the encoded data piece X1 is obtained by performing an XOR operation on the data segments A and C.

Each combination of data segments for an XOR operation is set according to the encoding matrix. The encoded data piece X1 corresponds to the first row of the encoding matrix. Therefore, the encoded data piece X1 is obtained by performing an XOR operation on the data segments A and C, a combination of which is indicated by the bit string 1010 in the first row of the encoding matrix. Similarly, each of the encoded data pieces X2, . . . , and X6 is obtained by performing an XOR operation on a data segment combination indicated by the bit string in the corresponding row (i.e., the second row, . . . , and the sixth row, respectively) of the encoding matrix.

On the other hand, the decoding processing to reconstruct the data segments A, B, C, and D is carried out by a method illustrated in FIG. 5. Assume that the encoded data pieces and information indicating the relationship between each encoded data piece and a row of the encoding matrix used to generate the encoded data piece have been transmitted from the transmitting side to the receiving side. Assume also that the encoded data pieces X3 and X6 have been lost during the transmission from the transmitting side to the receiving side. In this case, as illustrated in FIG. 5, the data segments A, B, C, and D are reconstructed by combining the normally received encoded data pieces X1, X2, X4, and X5.

For example, the encoded data piece X2 is the result obtained by performing an XOR operation on the data segments B and C. The encoded data piece X5 is the result obtained by performing an XOR operation on the data segments B, C, and D. Therefore, an operation result Y1 produced from an XOR operation on the encoded data pieces X2 and X5 equals to data obtained by reconstructing the data segment D.

Similarly, an operation result Y2 produced from an XOR operation on the encoded data piece X4 and the operation result Y1 equals to data obtained by reconstructing the data segment B. An operation result Y3 produced from an XOR operation on the encoded data piece X2 and the operation result Y2 equals to data obtained by reconstructing the data segment C. An operation result Y4 produced from an XOR operation on the encoded data piece X1 and the operation result Y3 equals to data obtained by reconstructing the data segment A. Thus, the data segments A, B, C, and D are reconstructed by combining the normally received encoded data pieces X1, X2, X4, and X5.

Note that the way of combining encoded data pieces for each XOR operation and the sequence of performing the XOR operations are not limited to the example of FIG. 5. In addition, by referring to information of the encoding matrix, it is possible to determine if all the data segments A, B, C, and D are reconstructible from the normally received encoded data pieces. Then, if not, it is possible to determine encoded data pieces needed to be retransmitted from the transmission side in order to reconstruct all the data segments A, B, C, and D.

For the purpose of illustration, FIGS. 3 to 5 depict an example where data redundancy is low with a small number of data segments and a small number of columns in the encoding matrix; however, increasing the data redundancy improves resistance to the loss of encoded data pieces. Note however that increased data redundancy increases the number of XOR operations performed in the encoding processing. The second embodiment provides a mechanism capable of reducing the number of XOR operations to be performed.

2-3. Hardware

Figure 6:
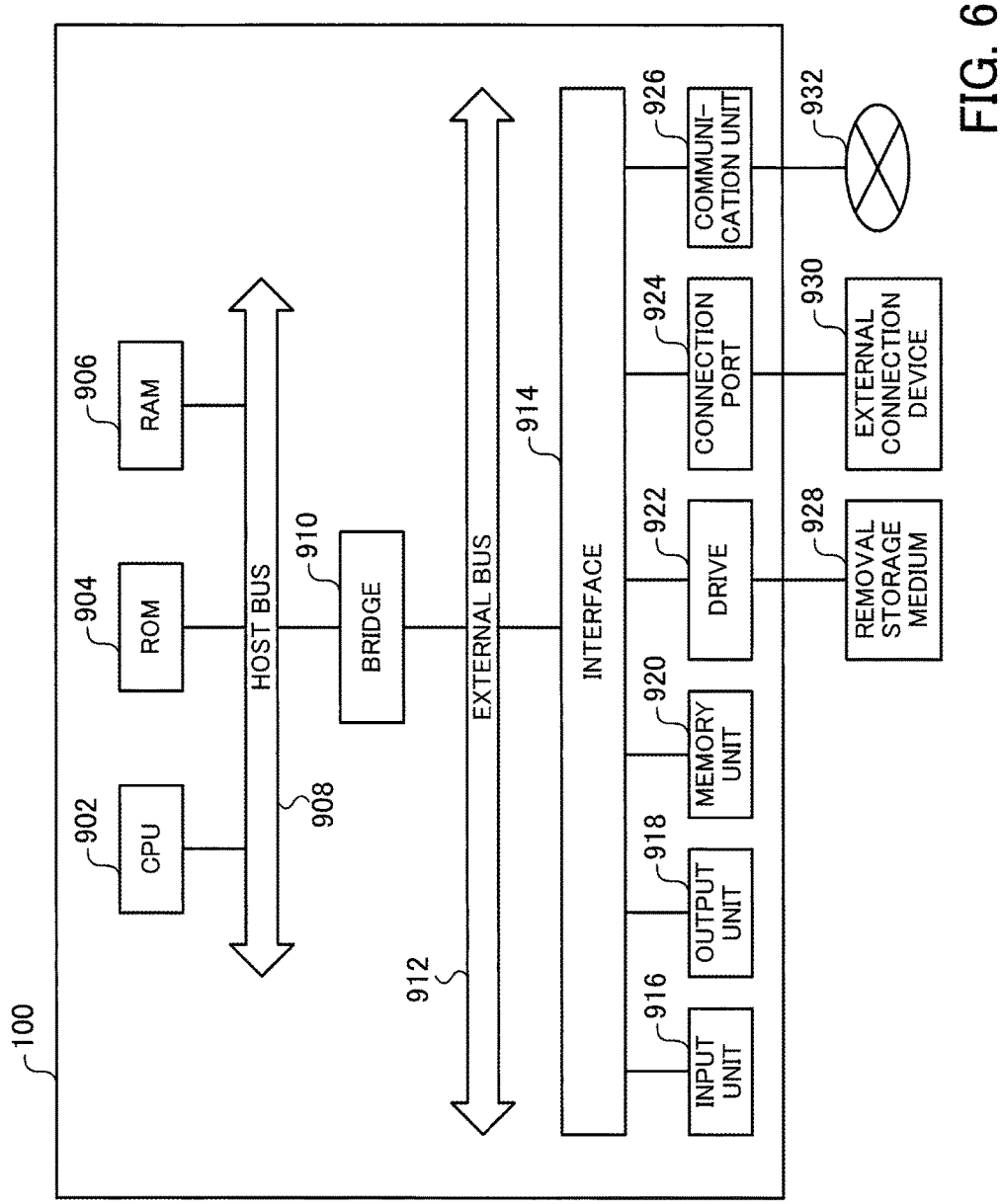
FIG. 6 illustrates an example of hardware capable of implementing functions of an encoding apparatus according to the second embodiment.

Next described is hardware of the encoding apparatus 100, with reference to FIG. 6. FIG. 6 illustrates an example of hardware capable of implementing functions of the encoding apparatus according to the second embodiment. The functions of the encoding apparatus 100 are implemented, for example, using hardware resources of an information processor illustrated in FIG. 6. That is, the functions of the encoding apparatus 100 are implemented by controlling hardware of FIG. 6 using a computer program.

As illustrated in FIG. 6, the hardware mainly includes a CPU 902, read only memory (ROM) 904, RAM 906, a host bus 908, and a bridge 910. The hardware also includes an external bus 912, an interface 914, an input unit 916, an output unit 918, a memory unit 920, a drive 922, a connection port 924, and a communication unit 926.

The CPU 902 functions, for example, as a operation processing unit or a control device, and exercises control over all, or a part of, operations of the individual components based on various programs recorded in the ROM 904, the RAM 906, the memory unit 920, or a removable storage medium 928. The ROM 904 is an example of a storage device for storing, for example, programs to be loaded into the CPU 902 and data or the like to be used for calculation. The RAM 906 temporarily or permanently stores therein, for example, programs to be loaded into the CPU 902 as well as various parameters to be altered in the execution of the programs.

These components are connected to each other, for example, via the host bus 908 capable of high-speed data transmission. On the other hand, the host bus 908 is connected, for example, through the bridge 910 to the external bus 912 with a relatively low data transmission speed. The input unit 916 is, for example, a mouse, a keyboard, a touch panel, a touch-pad, buttons, switches, levers or the like.

Further, the input unit 916 may be a remote controller capable of transmitting a control signal using infrared or other radio waves.

The output unit 918 is, for example, a display device such as a cathode ray tube (CRT), a liquid crystal display (LCD), a plasma display panel (PDP), or an electro-luminescence display (ELD). Further, an audio output device, such as a speaker or headphones, or a printer may be employed as the output unit 918. That is, the output unit 918 is a device capable of outputting information visually or audibly.

The memory unit 920 is a device for storing therein various types of data. The memory unit 920 is, for example, a magnetic storage device such as a HDD, or alternatively may be a semiconductor storage device such as a solid state drive (SSD) and a RAM disk, an optical storage device, or a magneto-optical storage device.

The drive 922 is a device for reading information recorded on the removable storage medium 928 and writing information to the removable storage medium 928. The removable storage medium 928 is, for example, a magnetic disk, an optical disk, a magneto-optical disk, or a semiconductor memory.

The connection port 924 is a port for connecting an external connection device 930, and is, for example, a universal serial bus (USB) port, an Institute of Electrical and Electronics Engineers (IEEE)-1394 port, a small computer system interface (SCSI), an RS-232C port, or an optical audio terminal. The external connection device 930 is, for example, a printer.

The communication unit 926 is a communication device used to connect with a network 932. The communication unit 926 is, for example, a wired or wireless local area network (LAN) communication circuit, a wireless USB (WUSB) communication circuit, an optical communication circuit or router, an Asymmetric Digital Subscriber Line (ADSL) communication circuit or router, or a mobile network communication circuit. The network 932 connected to the communication unit 926 is a network connected with a wire or wirelessly, and is, for example, the Internet, a LAN, a broadcasting network, or a satellite communication link.

The hardware for implementing the functions of the encoding apparatus 100 has been described thus far. Note that the functions of the decoding apparatus 200 may also be implemented using the hardware illustrated in FIG. 6.

2-4. Functions of Encoding Apparatus

Figure 7:
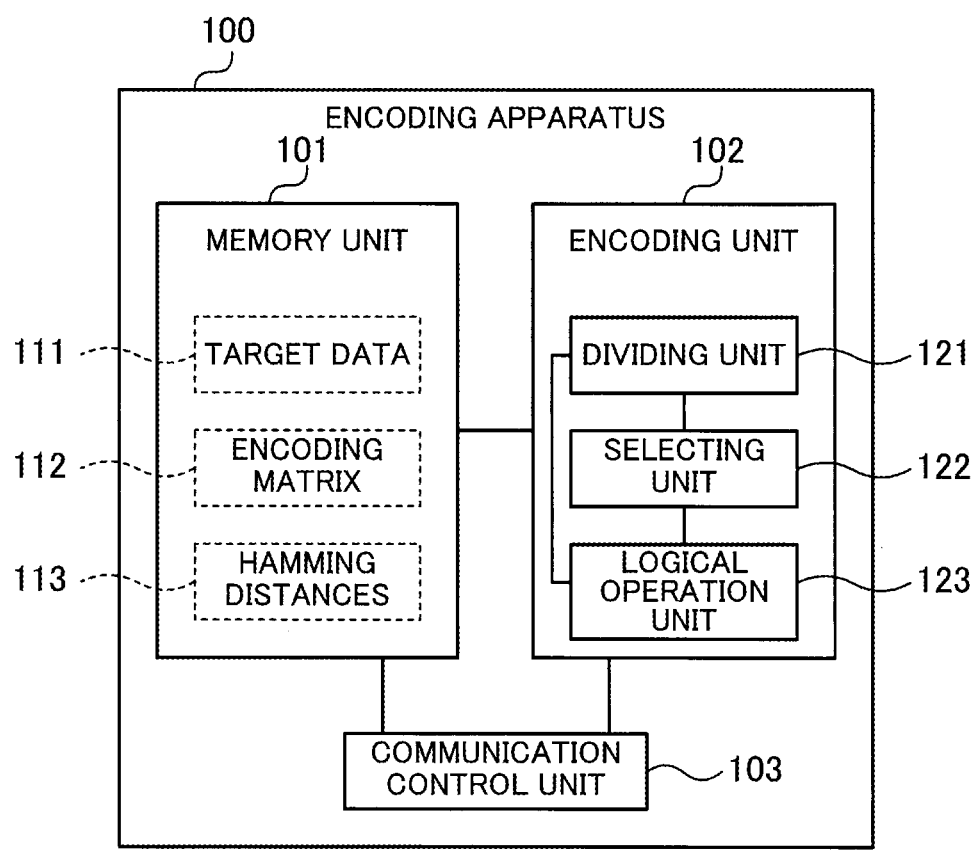
FIG. 7 is a block diagram illustrating an example of the functions of the encoding apparatus according to the second embodiment.
Figure 8:
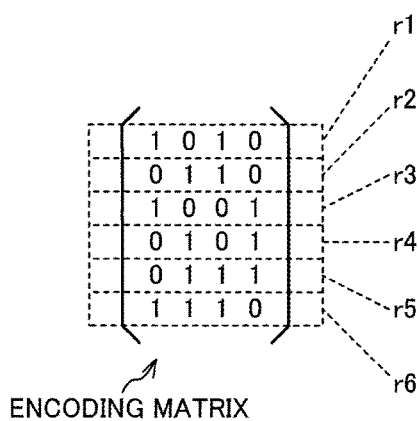
FIG. 8 illustrates an example of a Hamming distance table according to the second embodiment.
Figure 9:
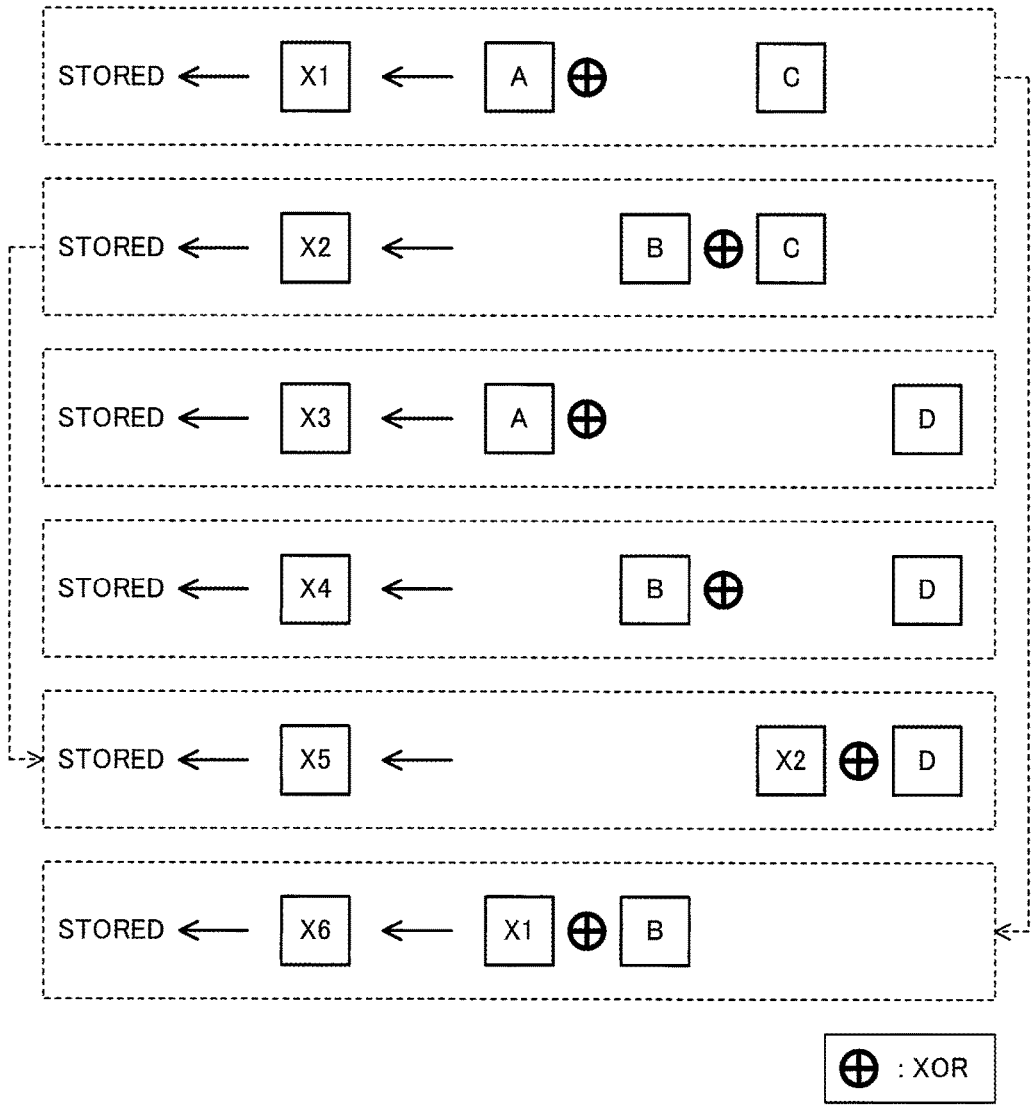
FIG. 9 is a diagram for explaining encoding processing of the second embodiment.

Next described are functions of the encoding apparatus 100, with reference to FIG. 7. FIG. 7 is a block diagram illustrating an example of functions of the encoding apparatus according to the second embodiment. Note that the following description refers to FIGS. 8 and 9 accordingly. FIG. 8 illustrates an example of a Hamming distance table according to the second embodiment. FIG. 9 is a diagram for explaining the encoding processing of the second embodiment.

As illustrated in FIG. 7, the encoding apparatus 100 includes a memory unit 101, an encoding unit 102, and a communication control unit 103. The function of the memory unit 101 is implemented using, for example, the RAM 906 or the memory unit 920 described above. The function of the encoding unit 102 is implemented using, for example, the CPU 902 above. The communication control unit 103 controls the connection port 924 and the communication unit 926 above to thereby implement the communication function of the encoding apparatus 100.

(Memory Unit 101)

The memory unit 101 stores therein target data 111, an encoding matrix 112, and Hamming distances 113. The target data 111 is an example of transmission data to be transmitted to the decoding apparatus 200. The encoding matrix 112 is an example of encoding information represented by a plurality of bit strings each indicating a combination of data segments. The Hamming distances 113 are Hamming distances each denoting the difference between two bit strings (i.e., the number of positions at which the corresponding bit values are different) included in the encoding matrix 112. For example, the memory unit 101 stores therein information of the Hamming distances 113 in a table form (hereinafter referred to as "Hamming distance table"), as illustrated in FIG. 8.

Now the Hamming distance table is described with reference to FIG. 8. Hereinafter, the bit strings in the first, second, . . . , and sixth rows of the encoding matrix are denoted by r1, r2, . . . , and r6, respectively. The bit strings r1, r2, . . . , and r6 are mapped to both the column and the row of the Hamming distance table, and each cell contains a value indicating the Hamming distance between two corresponding bit strings. For example, a cell H61 for the Hamming distance between the bit strings r1 and r6 contains a value of 1. Similarly, a cell H52 for the Hamming distance between the bit strings r2 and r5 contains a value of 1. Note that the Hamming distance table of FIG. 8 contains values only in the lower triangular portion.

(Encoding Unit 102)

The encoding unit 102 encodes the target data 111 stored in the memory unit 101, using the encoding matrix 112 and the Hamming distances 113 stored in the memory unit 101. The encoding unit 102 includes a dividing unit 121, a selecting unit 122, and a logical operation unit 123. The dividing unit 121 reads the target data 111 from the memory unit 101. Then, the dividing unit 121 divides the read target data 111 into a plurality of data segments. For example, the dividing unit 121 divides the target data 111 in such a manner that each of the data segments has a predetermined data size.

Referring to the Hamming distance table stored in the memory unit 101, the selecting unit 122 selects, with respect to each row of the Hamming distance table, a bit string corresponding to the minimum value of the Hamming distances 113 (note that the diagonal elements of the Hamming distance table are excluded from the selection).

For example, referring to the row of the bit string r5, the selecting unit 122 selects the bit string r2 corresponding to the cell H52 which contains the minimum value, 1, of the Hamming distances 113. Note that, in the example of FIG. 8, because the Hamming distance 113 between the bit strings r4 and r5 is also 1, the selecting unit 122 may select the bit string r4 instead. In like fashion, referring to the row of the bit string r6, the selecting unit 122 selects the bit string r1 corresponding to the cell H61 which contains the minimum value, 1, of the Hamming distances 113. Note that, in the example of FIG. 8, because the Hamming distance 113 between the bit strings r2 and r6 is also 1, the selecting unit 122 may select the bit string r2 instead.

Note however that the selecting unit 122 calculates, within each referenced bit string, the number of bits with a value of 1, and does not select a bit string for the referenced bit string row if the minimum value of the Hamming distances 113 is equal to or more than the calculated number of bits. As for the bit string r2 being 0110, for example, the number of bits with a value of 1 is 2. On the other hand, the minimum value of the Hamming distances 113 in the row of the bit string r2 is 2. Therefore, for the row of the bit string r2, no selection of a bit string corresponding to the minimum value of the Hamming distances 113 is made. The same applies to the bit strings r1, r3, and r4.

The information on the bit strings selected by the selecting unit 122 is input to the logical operation unit 123 and then used in encoding processing. For example, the information on the bit string r2 selected as a bit string corresponding to the minimum value of the Hamming distances 113 for the row of the bit string r5 is used in encoding processing based on the bit string r5. Similarly, the information on the bit string r1 selected as a bit string corresponding to the minimum value of the Hamming distances 113 for the bit string r6 is used in encoding processing based on the bit string r6.

The logical operation unit 123 generates encoded data pieces using the encoding matrix 112 stored in the memory unit 101, the information on the bit strings selected by the selecting unit 122, and the plurality of data segments generated by the dividing unit 121. For example, the logical operation unit 123 generates the encoded data pieces X1, X2, . . . , and X6 from the data segments A, B, C, and D by a method illustrated in FIG. 9.

Referring to the bit string r1 (1010) in the first row of the encoding matrix 112, the logical operation unit 123 determines the data segments A and C corresponding to the bit string r1 as targets of an XOR operation. Then, the logical operation unit 123 performs the XOR operation on the data segments A and C to generate the encoded data piece X1. The logical operation unit 123 subsequently stores the encoded data piece X1 in the memory unit 101.

Next, referring to the bit string r2 (0110) in the second row of the encoding matrix 112, the logical operation unit 123 determines the data segments B and C corresponding to the bit string r2 as targets of an XOR operation. Then, the logical operation unit 123 performs the XOR operation on the data segments B and C to generate the encoded data piece X2. The logical operation unit 123 subsequently stores the encoded data piece X2 in the memory unit 101.

Next, referring to the bit string r3 (1001) in the third row of the encoding matrix 112, the logical operation unit 123 determines the data segments A and D corresponding to the bit string r3 as targets of an XOR operation. Then, the logical operation unit 123 performs the XOR operation on the data segments A and D to generate the encoded data piece X3. The logical operation unit 123 subsequently stores the encoded data piece X3 in the memory unit 101.

Next, referring to the bit string r4 (0101) in the fourth row of the encoding matrix 112, the logical operation unit 123 determines the data segments B and D corresponding to the bit string r4 as targets of an XOR operation. Then, the logical operation unit 123 performs the XOR operation on the data segments B and D to generate the encoded data piece X4. The logical operation unit 123 subsequently stores the encoded data piece X4 in the memory unit 101. At this point in time, the encoded data pieces X1, X2, X3, and X4 are stored in the memory unit 101.

Next, the logical operation unit 123 refers to the bit string r5 (0111) in the fifth row of the encoding matrix 112. In association with the bit string r5, the information on the bit string r2 corresponding to the minimum value of the Hamming distances 113 has been input. Therefore, the logical operation unit 123 determines whether the encoded data piece X2 corresponding to the bit string r2 has been stored in the memory unit 101. According to the example of FIG. 9, the encoded data piece X2 has already been calculated and stored in the memory unit 101. Therefore, the logical operation unit 123 reads the encoded data piece X2 from the memory unit 101.

After reading the encoded data piece X2, the logical operation unit 123 extracts, from the bit string r5, one or more bits different from the bits of the bit string r2. In the example of FIG. 9, the fourth bit (corresponding to the data segment D) in the bit string r5 is extracted. Then, the logical operation unit 123 performs an XOR operation on the encoded data piece X2 and the data segment D to generate the encoded data piece X5. Subsequently, the logical operation unit 123 stores the encoded data piece X5 in the memory unit 101.

Next, the logical operation unit 123 refers to the bit string r6 (1110) in the sixth row of the encoding matrix 112. In association with the bit string r6, the information on the bit string r1 corresponding to the minimum value of the Hamming distances 113 has been input. Therefore, the logical operation unit 123 determines whether the encoded data piece X1 corresponding to the bit string r1 has been stored in the memory unit 101. According to the example of FIG. 9, the encoded data piece X1 has already been calculated and stored in the memory unit 101. Therefore, the logical operation unit 123 reads the encoded data piece X1 from the memory unit 101.

After reading the encoded data piece X1, the logical operation unit 123 extracts, from the bit string r6, one or more bits different from the bits of the bit string r1. In the example of FIG. 9, the second bit (corresponding to the data segment B) in the bit string r6 is extracted. Then, the logical operation unit 123 performs an XOR operation on the encoded data piece X1 and the data segment B to generate the encoded data piece X6. Subsequently, the logical operation unit 123 stores the encoded data piece X6 in the memory unit 101.

The encoding processing illustrated in FIG. 9 produces the same operation results as the encoded data pieces X1, X2, . . . , and X6 obtained by the encoding processing illustrated in FIG. 4. Note however that, when compared to the encoding processing of FIG. 4, the encoding processing of FIG. 9 involves a fewer number of XOR operations. This difference results from how to generate the encoded data pieces X5 and X6. As described above, the logical operation unit 123 uses the already calculated encoded data piece X2 to generate the encoded data piece X5, and also uses the already calculated encoded data piece X1 to generate the encoded data piece X6. Therefore, redundant processing included in a series of calculations is omitted, which allows a reduction in the number of XOR operations.

(Communication Control Unit 103)

The communication control unit 103 transmits the encoded data pieces generated by the logical operation unit 123 to the decoding apparatus 200. On this occasion, the communication control unit 103 communicates with the decoding apparatus 200 according to the UDP. In addition, upon receiving a retransmission request from the decoding apparatus 200, the communication control unit 103 retransmits encoded data pieces designated in the retransmission request to the decoding apparatus 200.

The functions of the encoding apparatus 100 have been described thus far.

2-5. Functions of Decoding Apparatus

Figure 10:
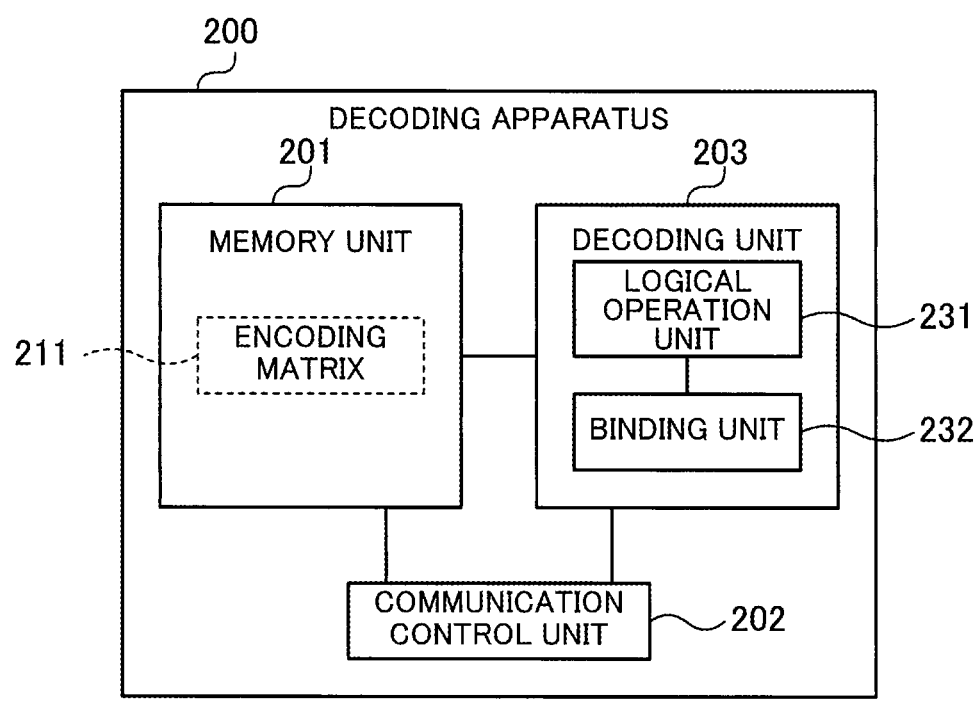
FIG. 10 is a block diagram illustrating an example of functions of a decoding apparatus according to the second embodiment.

Next described are functions of the decoding apparatus 200, with reference to FIG. 10. FIG. 10 is a block diagram illustrating an example of functions of the decoding apparatus according to the second embodiment.

As illustrated in FIG. 10, the decoding apparatus 200 includes a memory unit 201, a communication control unit 202, and a decoding unit 203. The function of the memory unit 201 is implemented using, for example, the RAM 906 or the memory unit 920 described above. The communication control unit 202 controls the connection port 924 and the communication unit 926 above to thereby implement the communication function of the encoding apparatus 200. The function of the decoding unit 203 is implemented using, for example, the CPU 902 above.

(Memory Unit 201)

The memory unit 201 stores therein an encoding matrix 211. The encoding matrix 211 is the same as the encoding matrix 112 stored in the memory unit 101 of the encoding apparatus 100. The encoding matrix 211 is used in decoding processing to be described later.

(Communication Control Unit 202)

The communication control unit 202 receives encoded data pieces transmitted by the encoding apparatus 100. On this occasion, the communication control unit 202 communicates with the encoding apparatus 100 according to the UDP. In addition, when having failed to reconstruct some data segments by the decoding processing to be described later, the communication control unit 202 requests the encoding apparatus 100 to retransmit encoded data pieces needed to decode the data segments failed to be reconstructed.

(Decoding Unit 203)

The decoding unit 203 reconstructs data segments using normally received encoded data pieces. Then, the decoding unit 203 binds the reconstructed data segments to reconstruct the target data 111. The decoding unit 203 includes a logical operation unit 231 and a binding unit 232. The logical operation unit 231 executes, for example, the decoding processing illustrated in FIG. 5 to thereby reconstruct the data segments from the encoded data pieces.

In the example of FIG. 5, the encoded data pieces X3 and X6 are lost during transmission from the encoding apparatus 100 to the decoding apparatus 200. In this case, the logical operation unit 231 generates the data segments A, B, C, and D by combining the normally received encoded data pieces X1, X2, X4, and X5, as illustrated in FIG. 5. For example, the logical operation unit 231 performs an XOR operation on the encoded data pieces X2 and X5 to thereby reconstruct the data segment D (the operation result Y1).

Similarly, the logical operation unit 231 performs an XOR operation on the encoded data piece X4 and the operation result Y1 to thereby reconstruct the data segment B (the operation result Y2). The logical operation unit 231 performs an XOR operation on the encoded data piece X2 and the operation result Y2 to thereby reconstruct the data segment C (the operation result Y3). The logical operation unit 231 performs an XOR operation on the encoded data piece X1 and the operation result Y3 to thereby reconstruct the data segment A (the operation result Y4). Thus, the logical operation unit 231 combines the normally received encoded data pieces X1, X2, X4, and X5 to thereby reconstruct the data segments A, B, C, and D.

The binding unit 232 reconstructs the target data 111 by binding data segments reconstructed by the logical operation unit 231. For example, the binding unit 232 binds the data segments A, B, C, and D to reconstruct the target data 111.

The functions of the decoding apparatus 200 have been described thus far.

2-6. Encoding Processing Flow

Figure 11:
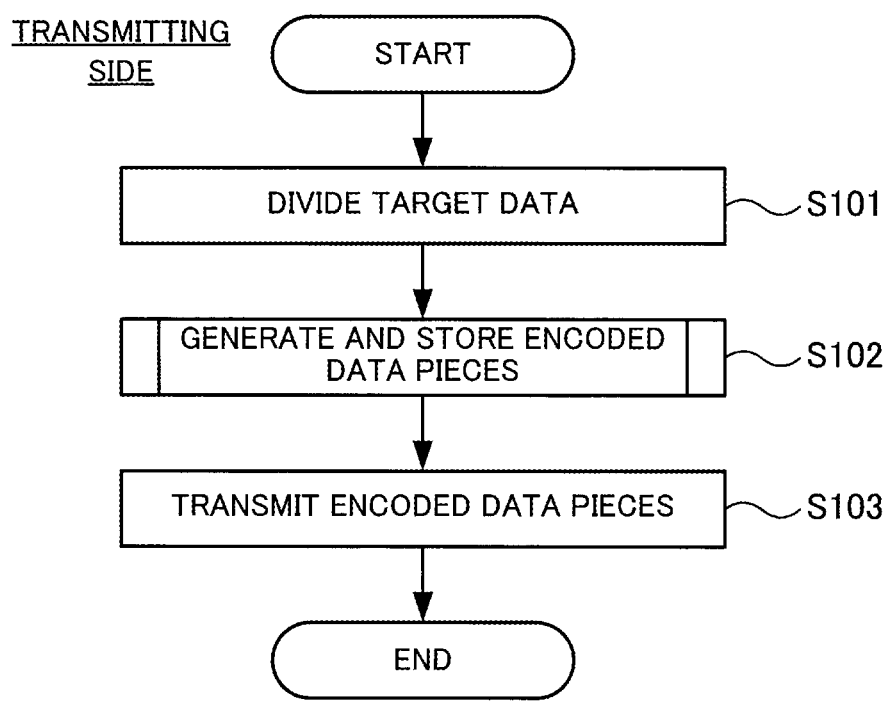
FIG. 11 is a first flow diagram illustrating a flow of processing executed by the encoding apparatus according to the second embodiment.
Figure 12:
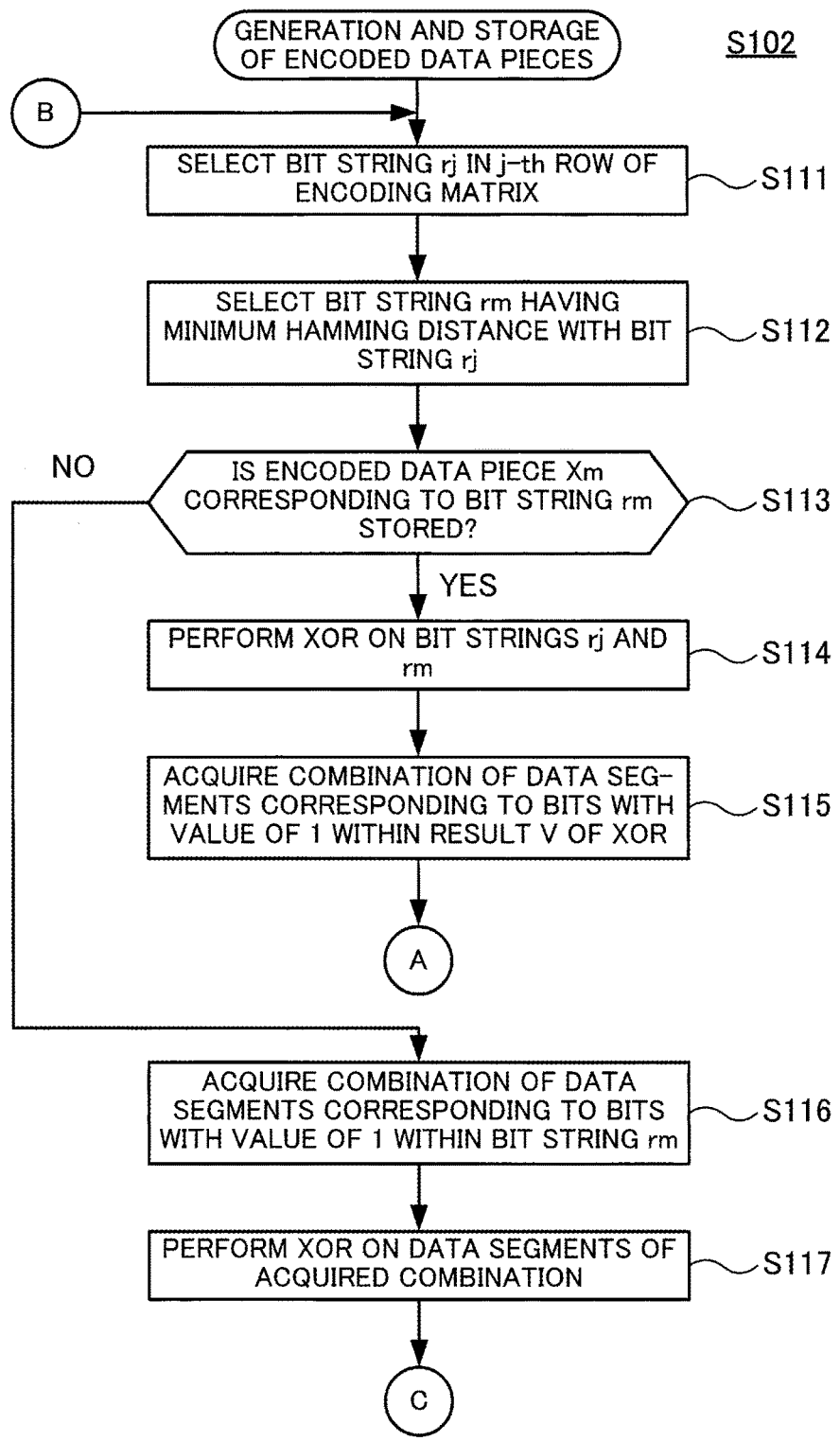
FIG. 12 is a second flow diagram illustrating the flow of the processing executed by the encoding apparatus according to the second embodiment.
Figure 13:
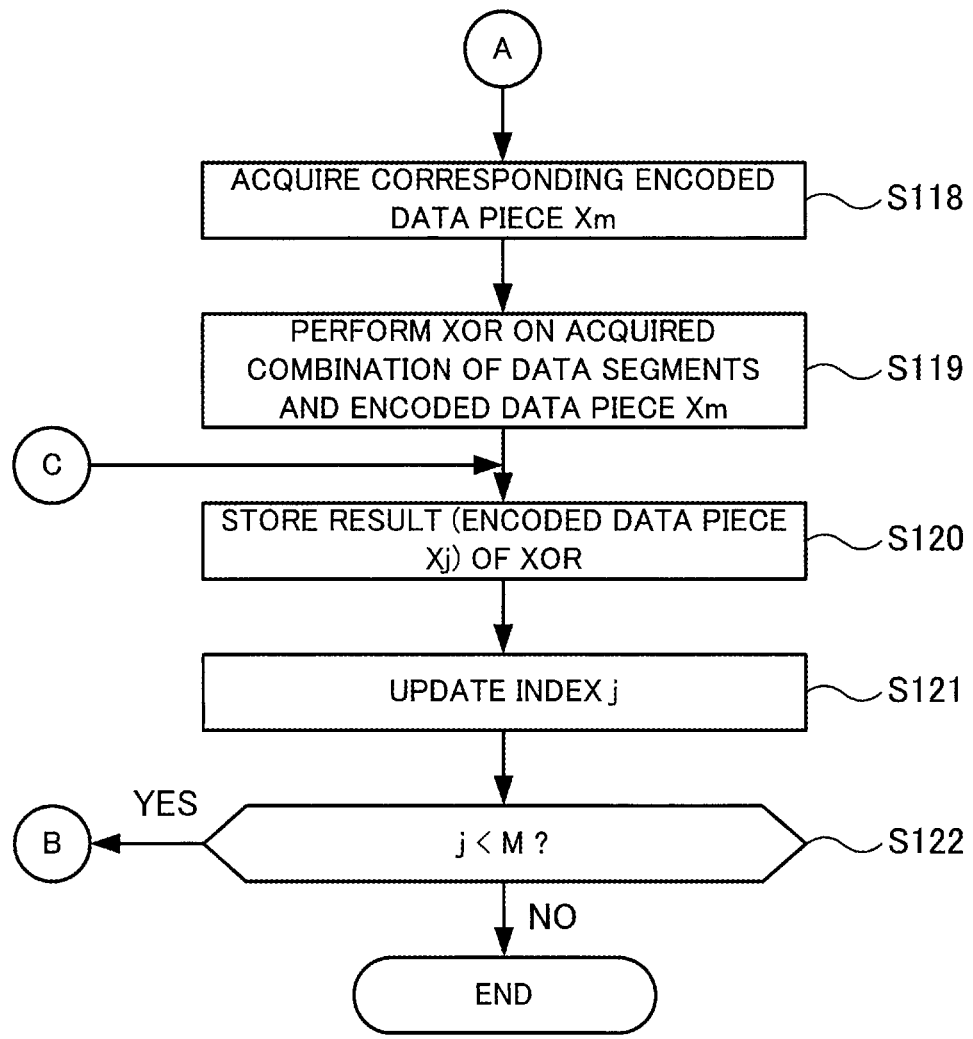
FIG. 13 is a third flow diagram illustrating the flow of the processing executed by the encoding apparatus according to the second embodiment.

Next described is a flow of the encoding processing executed by the encoding apparatus 100, with reference to FIGS. 11 to 13. FIG. 11 is a first flow diagram illustrating a flow of processing executed by the encoding apparatus according to the second embodiment. FIG. 12 is a second flow diagram illustrating the flow of the processing executed by the encoding apparatus according to the second embodiment. FIG. 13 is a third flow diagram illustrating the flow of the processing executed by the encoding apparatus according to the second embodiment.

First, the overall flow of the encoding processing is described with reference to FIG. 11.

(S101) The encoding unit 102 reads the target data 111 from the memory unit 101. Then, the encoding unit 102 divides the read target data 111 into a plurality of data segments. For example, the encoding unit 102 divides the target data 111 in such a manner that each of the data segments has a predetermined data size.

(S102) The encoding unit 102 generates encoded data pieces using the encoding matrix 112 stored in the memory unit 101 and the plurality of data segments. Then, the encoding unit 102 stores (saves) the generated encoded data pieces in the memory unit 101. Note that the processing flow of generating the encoded data pieces is described in detail later.

(S103) The communication control unit 103 transmits the encoded data pieces generated by the encoding unit 102 to the decoding apparatus 200. On this occasion, the communication control unit 103 communicates with the decoding apparatus 200 according to the UDP. In addition, upon receiving a retransmission request from the decoding apparatus 200, the communication control unit 103 retransmits encoded data pieces designated in the retransmission request to the decoding apparatus 200.

The overall flow of the encoding processing has been described thus far.

The processing flow of generating and storing the encoded data pieces (S102) is further described next, with reference to FIGS. 12 and 13.

(S111) With reference to the encoding matrix 112 stored in the memory unit 101, the encoding unit 102 selects a bit string rj in the j-th row of the encoding matrix 112. Note that the index j is initialized to 1 at the start of step S102.

(S112) The encoding unit 102 refers to the Hamming distance table stored in the memory unit 101. Then, the encoding unit 102 selects a bit string rm which has, with the bit string rj, the minimum value of the Hamming distances 113.

(S113) The encoding unit 102 determines whether an encoded data piece Xm corresponding to the bit string rm is stored (saved) in the memory unit 101. If the encoded data piece Xm corresponding to the bit string rm is stored in the memory unit 101, the processing moves to step S114. On the other hand, if the encoded data piece Xm corresponding to the bit string rm is not stored in the memory unit 101, the processing moves to step S116.

(S114 and S115) The encoding unit 102 performs an exclusive OR operation (XOR operation) on the bit strings rj and rm to thereby generate a bit string V. Then, the encoding unit 102 acquires a combination of data segments corresponding to bits each with a value of 1 within the bit string V. After steps S114 and 115 are completed, the processing moves to step S118 of FIG. 13.

(S116 and S117) The encoding unit 102 acquires a combination of data segments corresponding to bits each with a value of 1 within the bit string rm. Then, the encoding unit 102 performs an XOR operation on the acquired combination of data segments to generate an encoded data piece Xj. After steps S116 and S117 are completed, the processing moves to step S120 of FIG. 13.

(S118 and S119) The encoding unit 102 acquires, from the memory unit 101, the encoded data piece Xm corresponding to the acquired combination of data segments. Then, the encoding unit 102 performs an XOR operation on the acquired combination of data segments and the encoded data piece Xm to thereby generate an encoded data piece Xj.

(S120 and S121) The encoding unit 102 stores (saves) the encoded data piece Xj in the memory unit 101. Then, the encoding unit 102 changes the index j by one increment (that is, updates the index j to its value increased by 1).

(S122) The encoding unit 102 compares the index j with a total number of rows M in the encoding matrix 112. If the index j is smaller than the total number of rows M in the encoding matrix 112 (i.e., j<M), the processing moves to step S111 of FIG. 12. On the other hand, if the index j is equal to or more than the total number of rows M of the encoding matrix 112 (j≥M), a series of processing illustrated in FIGS. 11 and 12 ends.

The flow of the encoding processing executed by the encoding apparatus 100 has been described thus far.

2-7. Decoding Processing Flow

Figure 14:
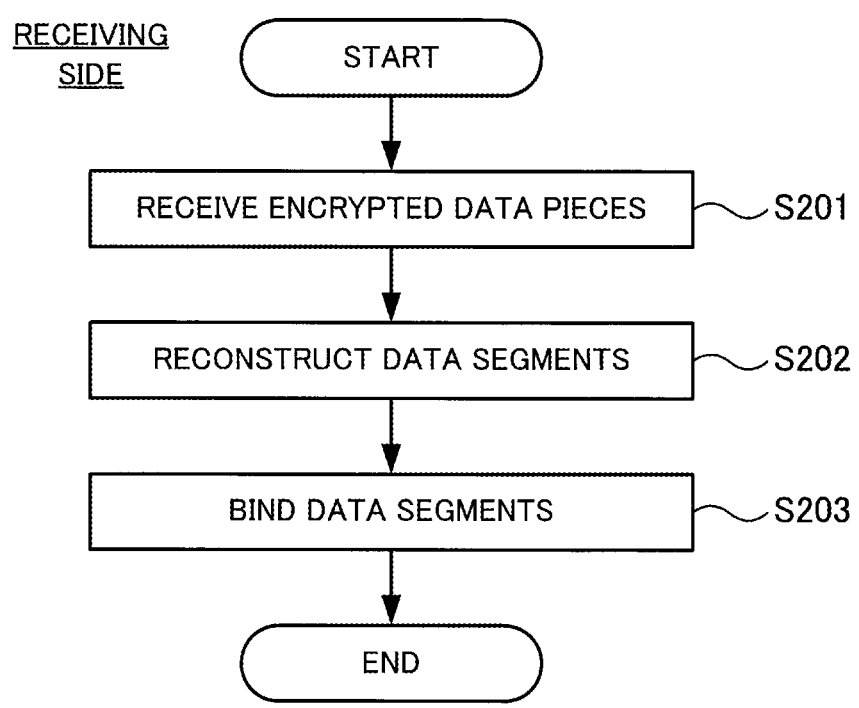
FIG. 14 is a flow diagram illustrating a flow of processing executed by the decoding apparatus according to the second embodiment.

Next described is a flow of the decoding processing executed by the decoding apparatus 200, with reference to FIG. 14. FIG. 14 is a flow diagram illustrating a flow of processing executed by the decoding apparatus according to the second embodiment.

(S201) The communication control unit 202 receives encoded data pieces transmitted by the encoding apparatus 100. On this occasion, the communication control unit 202 communicates with the encoding apparatus 100 according to the UDP. In addition, if having failed to reconstruct some data segments by decoding processing to be described below, the communication control unit 202 requests the encoding apparatus 100 to retransmit encoded data pieces needed to decode the data segments failed to be reconstructed.

(S202 and S203) The decoding unit 203 reconstructs data segments using normally received encoded data pieces. Then, the decoding unit 203 reconstructs the target data 111 by binding the reconstructed data segments. After steps S202 and S203 are completed, a series of processing illustrated in FIG. 14 ends.

The flow of the decoding processing executed by the decoding apparatus 200 has been described thus far.

As described above, it is possible to reduce the number of XOR operations by saving already generated encoded data pieces and using the saved encoded data pieces to generate other encoded data pieces. This allows operation load associated with encoding to be controlled.

The second embodiment has been described thus far.

3. Modification (Application of BDD)

Next described is a modification of the second embodiment. The modification is directed to a mechanism for representing the processes of calculating the Hamming distances 113 and selecting a bit string corresponding to each minimum value of the Hamming distances 113 by binary decision diagrams (BDD), which further reduces processing load.

3-1. BDD

Figure 16:
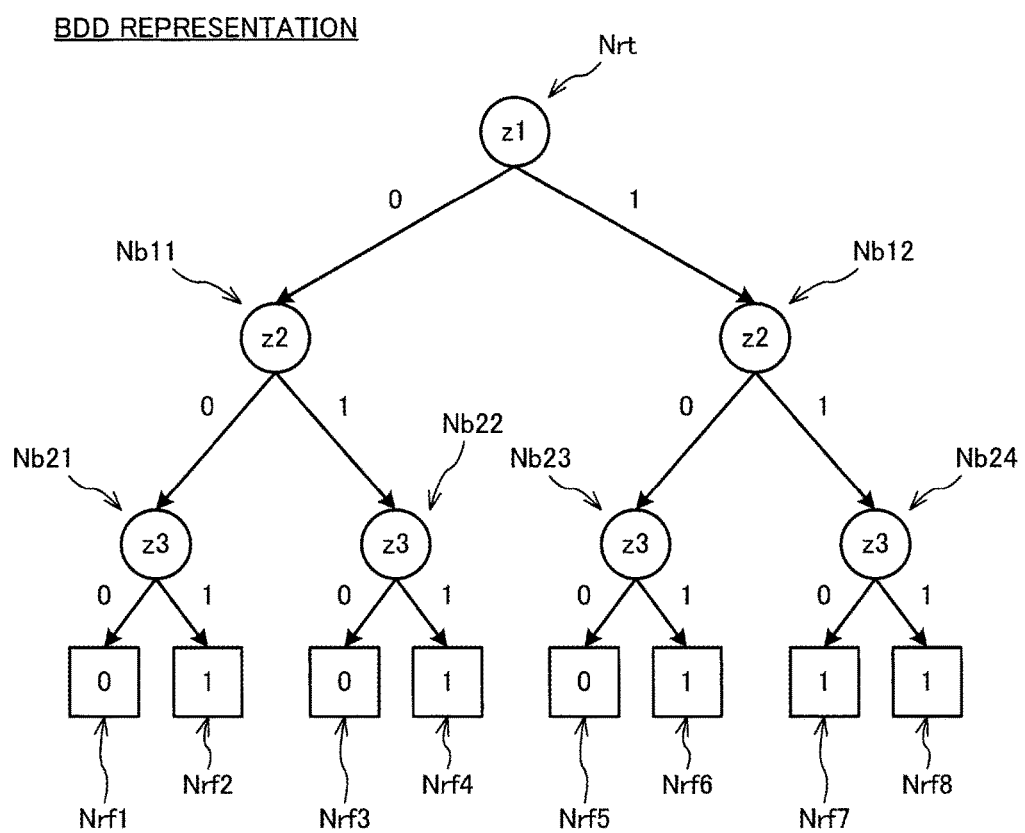
FIG. 16 is a second diagram for explaining the BDD representation according to the modification of the second embodiment.
Figure 17:
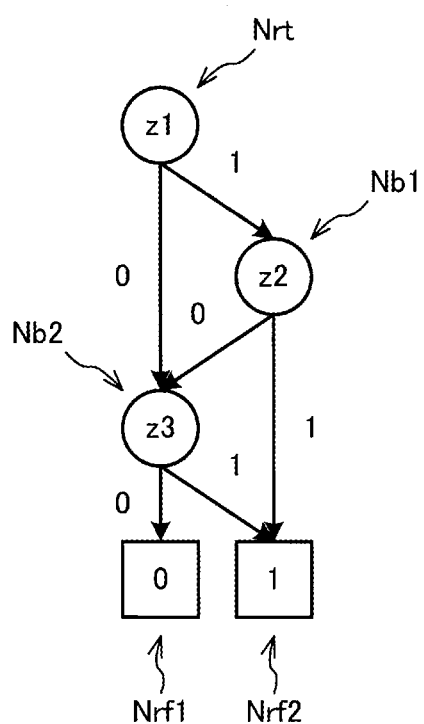
FIG. 17 is a third diagram for explaining the BDD representation according to the modification of the second embodiment.

First, a BDD representation is described with reference to FIGS. 15 to 17. FIG. 15 is a first diagram for explaining a BDD representation according to the modification of the second embodiment. FIG. 16 is a second diagram for explaining the BDD representation according to the modification of the second embodiment. FIG. 17 is a third diagram for explaining the BDD representation according to the modification of the second embodiment.

A method for representing a function f illustrated in FIG. 15 by a BDD is described for the purpose of illustration. The function f of FIG. 15 outputs a one-bit value in response to an input of three bit values $z1$, $z2$, and $z3$ (hereinafter sometimes referred to as "bit string z"). For example, the function f outputs a bit value of 0 for an input of a bit string 000. In addition, the function f outputs a bit value of 1 for an input of a bit string 001. As for each of the remaining input bit strings, a bit value as illustrated in FIG. 15 is output.

FIG. 16 represents the function f of FIG. 15 by a binary tree. As illustrated in FIG. 16, the BDD includes a root node Nrt, branch nodes Nb11, . . . , and Nb24, and leaf nodes Nrf1, . . . , and Nrf8. Each of the root node Nrt and the branch nodes Nb11, . . . , and Nb24 is assigned one of the bit values $z1$, $z2$, and $z3$. Further, each of the leaf nodes Nrf1, . . . , and Nrf8 is assigned a value of either 0 or 1. Each line connecting two nodes is called "branch".

Each of the root node Nrt and the branch nodes Nb11, . . . , and Nb24 represents a conditional branching point. A branch leading to a lower node is selected according to the result of the conditional branching. Let us consider, for example, a case where the bit string z is 101 ($z1=1$, $z2=0$, and $z3=1$). In this case, because $z1$ is 1, a branch with a value of 1 is selected at the conditional branching point of the root node Nrt.

In addition, at the conditional branching point of the branch node Nb12 located at the end of the selected branch, a branch with a value of 0 is selected because $z2$ is 0. At the conditional branching point of the branch node Nb23 located at the end of the selected branch, a branch with a value of 1 is selected because $z3$ is 1. Then, the leaf node Nrf6 located at the end of the selected branch indicates the output value. According to the example of FIG. 16, the leaf node Nrf6 indicates 1.

The binary tree of FIG. 16 is structured in such a manner that combinations of input values, conditional branching, and an output value are consistent with the function f of FIG. 15. Therefore, an output value of the function f according to input values is obtained by following nodes and branches, as described above. That is, the binary-tree representation of FIG. 16 is equivalent to the table representation of the function f illustrated in FIG. 15. Note however that the binary tree may be altered to a BDD of FIG. 17, which is a compressed representation of the binary tree.

Next described is how to compress a binary tree, with reference to FIGS. 16 and 17. First, in the binary tree of FIG. 16, take notice of the branch node Nb24. The branch node Nb24 represents conditional branching associated with the bit value $z3$. Note however that both the leaf nodes Nrf7 and Nrf8 at the end of the individual branches extended from the branch node Nb24 are assigned a bit value of 1. That is, the output value is 1 regardless of the presence or absence of the conditional branching of the branch node Nb24.

Therefore, the binary tree is altered in such a manner that the branch node Nb24 is omitted and the output value becomes 1 if the bit value $z2$ is 1 at the conditional branching point of the branch node Nb12. That is, it is possible to compress the binary tree. Next, take notice of the ends of the two branches extending from the branch node Nb11. One of the branches is connected to the branch node Nb21, and the other is connected to the branch node Nb22. Both the branch nodes Nb21 and Nb22 are conditional branching associated with the bit value $z3$.

When the combination of the branch node Nb21 and the leaf nodes Nrf1 and Nrf2 is compared to the combination of the branch node Nb22 and the leaf nodes Nrf3 and Nrf4, it is understood that both the combinations represent the same conditions and the same output results. Therefore, the same logical sequence occurs regardless of the presence or absence of the branch node Nb11. Therefore, the binary tree is altered in such a manner that the branch nodes Nb11 and Nb22 and the leaf nodes Nrf3 and Nrf4 are omitted and the end of the branch extending from the root node Nrt and assigned a value of 0 is connected to the branch node Nb21.

Further, because the configuration of the branch node Nb23 and the leaf nodes Nrf5 and Nrf6 is the same as the configuration of the branch node Nb21 and the leaf nodes Nrf1 and Nrf2, the branch node Nb23 and the leaf nodes Nrf5 and Nrf6 may also be omitted. After omitting nodes in the above-described manner and organizing the relationship among the branch connections, a BDD illustrated in FIG. 17 is obtained. As a matter of course, the binary tree of FIG. 16 and the BDD of FIG. 17 represent the same thing. The BDD of FIG. 17 has fewer nodes compared to the binary tree of FIG. 16. Therefore, the use of the compressed BDD reduces the number of conditional branching processes needed to be taken, thus reducing processing load.

As described above, a BDD representation in a compressed form results in a reduction in processing load. In addition, in the case of connecting a plurality of logic functions by logical operations, changes are made directly to a BDD in a compressed form to thereby generate a BDD to be obtained after the logical operations. Using such characteristics of BDDs further promotes the efficiency of the encoding processing of the second embodiment. How to apply BDDs and the like are described below.

3-2. Calculation of Hamming Distances

Figure 18:
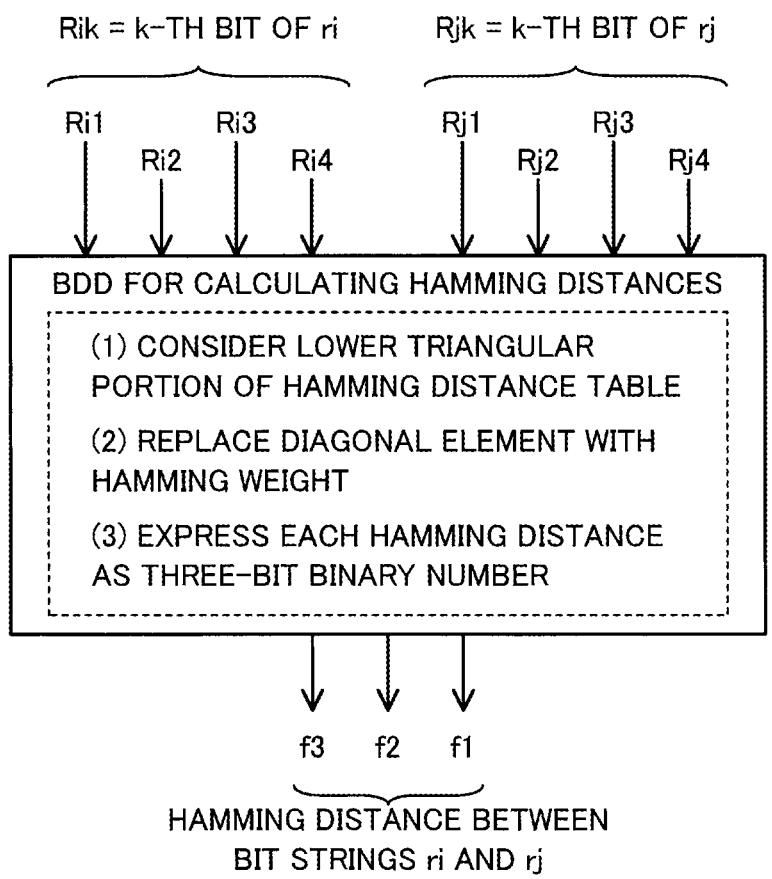
FIG. 18 is a first diagram illustrating a method for calculating Hamming distances according to the modification of the second embodiment.
Figure 19:
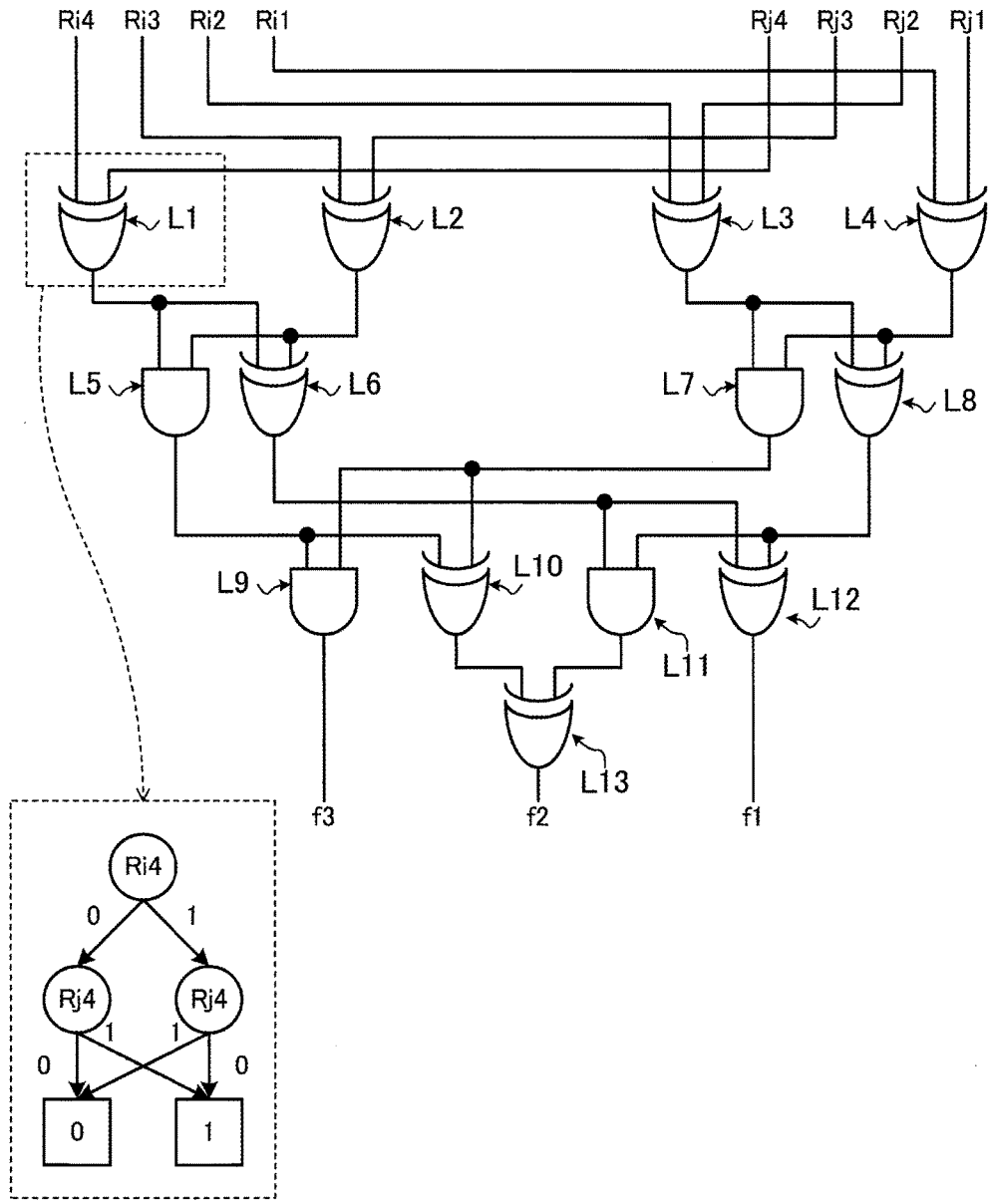
FIG. 19 is a second diagram illustrating the method for calculating the Hamming distances according to the modification of the second embodiment.
Figure 20:
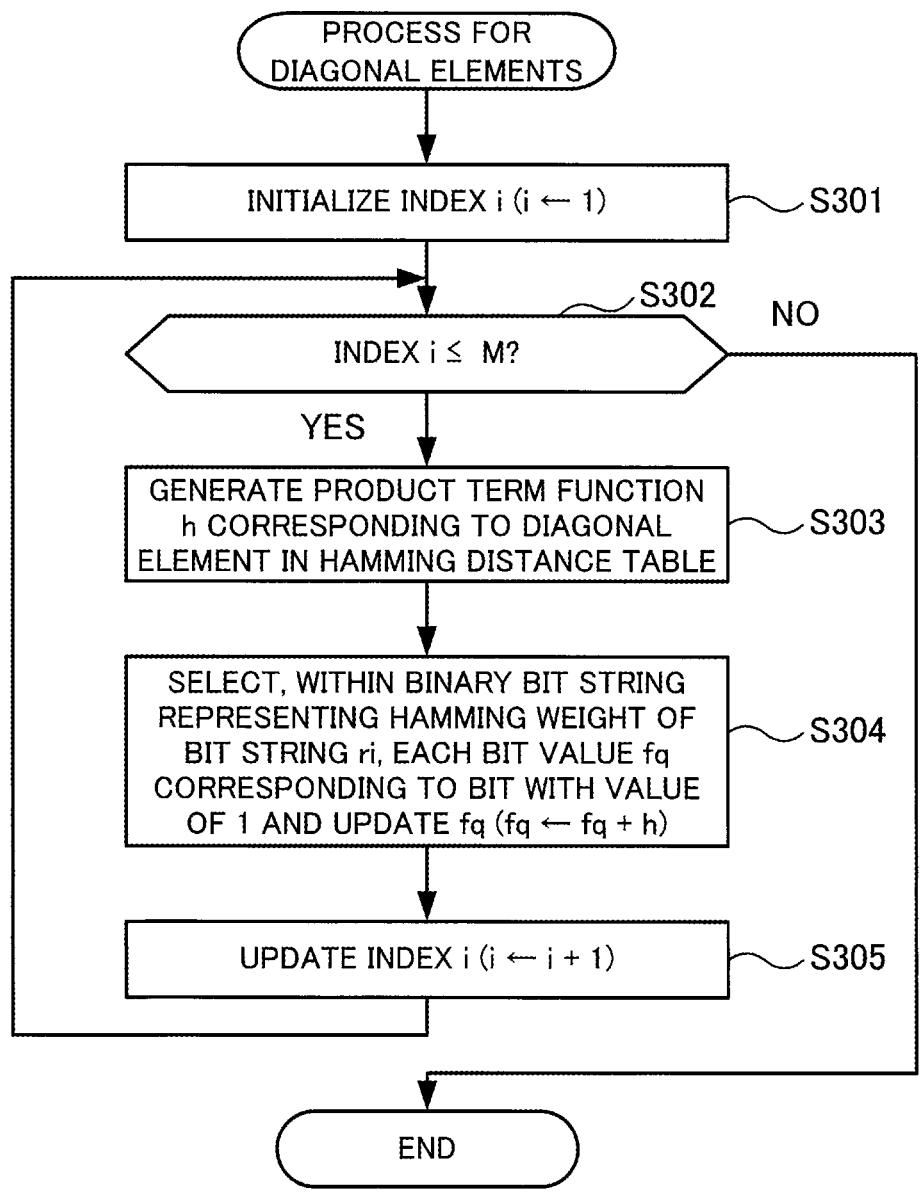
FIG. 20 is a third diagram illustrating the method for calculating the Hamming distances according to the modification of the second embodiment.

First, how to apply BDD representations to the calculation of the Hamming distances 113 is described, with reference to FIGS. 18 to 20. FIG. 18 is a first diagram illustrating a method for calculating the Hamming distances according to the modification of the second embodiment. FIG. 19 is a second diagram illustrating the method for calculating the Hamming distances according to the modification of the second embodiment. FIG. 20 is a third diagram illustrating the method for calculating the Hamming distances according to the modification of the second embodiment.

First, let us consider logical operations for calculating the Hamming distance between a bit string ri corresponding to the i-th row (i=1 to M) of the encoding matrix 112 and a bit string rj corresponding to the j-th row (j=1 to M) of the encoding matrix 112. If it is possible to represent the calculation of the Hamming distance as a logical operation, a BDD representation is applicable to the calculation.

Note that a bit value of the k-th bit (k=1 to 4) in the bit string ri is denoted by Rik, and a bit value of the k-th bit in the bit string rj is denoted by Rjk. Consider a logical operation taking bit values Ri1, . . . , Ri4, Rj1, . . . , and Rj4 as its input and producing three bit values f1, f2, and f3 representing the Hamming distance as its output, as illustrated in FIG. 18. Note that the first, second, and third bits of the bit string representing the Hamming distance are f1, f2, and f3, respectively. In addition, the bit values Ri1, . . . , and Ri4 are sequentially the first, . . . , and fourth bit values, respectively, of the bit string ri. Similarly, the bit values Rj1, . . . , and Rj4 are sequentially the first, . . . , and fourth bit values, respectively, of the bit string rj.

In addition, (1) a logical operation (corresponding to a logical operation g to be described later) is incorporated which takes account only of output values corresponding to the lower triangular portion of the Hamming distance table. (2) A logical operation is incorporated which replaces output values corresponding to the diagonal elements in the Hamming distance table with Hamming weights. A Hamming weight indicates the number of bits with a value of 1 within a target bit string. (3) A logical operation is considered that expresses its output value as a three-bit binary number and outputs each of the three bit values f1, f2, and f3.

The logical operation for calculating the bit values f1, f2, and f3 representing the Hamming distance 113 is represented, for example, by combining basic logical operations L1, . . . , and L13, as illustrated in FIG. 19. Note that the logical operations L1, L2, L3, L4, L6, L8, L10, L12, and L13 are XOR operations. On the other hand, the logical operations L5, L7, L9, and L11 are AND operations.

For example, the logical operation L1 which is an XOR operation may be represented by the BDD illustrated in FIG. 19. Each of the logical operations L1, . . . , and L13 is represented by a BDD, and all the BDDs are integrated and then compressed. Herewith, a BDD for calculating the individual bit values f1, f2, and f3 is generated.

The process of replacing output values corresponding to the diagonal elements of the Hamming distance table with Hamming weights is executed, for example, in the manner illustrated in FIG. 20. The flow of the processing of FIG. 20 is described next. Note that the processing of FIG. 20 is executed, for example, by the encoding unit 102 of the encoding apparatus 100.

(S301) The encoding unit 102 initializes the index i. Herewith, the index i is set to 1.

(S302) The encoding unit 102 determines whether the index i is equal to or less than the total number of rows M of the encoding matrix 112. If the index i is equal to or less than the total number of rows M, the processing moves to step S303. On the other hand, if the index i is not equal to or less than the total number of rows M, a series of processing of FIG. 20 ends.

(S303) The encoding unit 102 generates a product term function h corresponding to the diagonal element (i=j) of the Hamming distance table. For example, the product term function h corresponding to ri=rj=1010 is Ri4·Rri3·Ri2·Rri1·Rj4·Rrj3·Rj2·Rrj1. Note that the symbol Rrjk (k=1 to 4) is obtained by performing a NOT operation on the variable Rjk. In addition, the symbol · indicates an AND operation. That is, the product term function h is a logic function that inverts logical variables corresponding to bits with a value of 0 within the bit string ri and performs AND operations on the individual input-bit logical variables.

(S304) Within a binary bit string representing the Hamming weight of the bit string ri, the encoding unit 102 selects each bit value fq (q=1 to 3) corresponding to a bit with a value of 1. For example, in the case where the binary representation of the Hamming weight is 011, the bit values f1 and f2 are selected. Then, the encoding unit 102 updates the bit value fq to (fq+h). Note here that the symbol + associated with a logic function represents an OR operation.

(S305) The encoding unit 102 changes the index i by one increment (that is, updates the index i to its value increased by 1). After step S305 is completed, the processing moves to step S302.

The method for applying BDD representations to the calculation of the Hamming distances 113 has been described thus far. As described above, the calculation of the Hamming distances is represented by logical operations. Therefore, representing the logical operations by BDDs allows the calculation of the Hamming distances using the BDDs. Then, compression of each BDD enables a reduction in processing load.

3-3. Selection of Minimum Hamming Distances

Next described is how to apply BDDs to the process of selecting a bit string corresponding to each minimum value of the Hamming distances 113, with reference to FIGS. 21 to 28. Assume that a BDD for calculating the three bit values f1, f2, and f3 representing each of the Hamming distances 113 has already been obtained. Also assume that the processing for bit values corresponding to the diagonal elements in the Hamming distance table (see FIG. 20) has already been performed.

Figure 21:
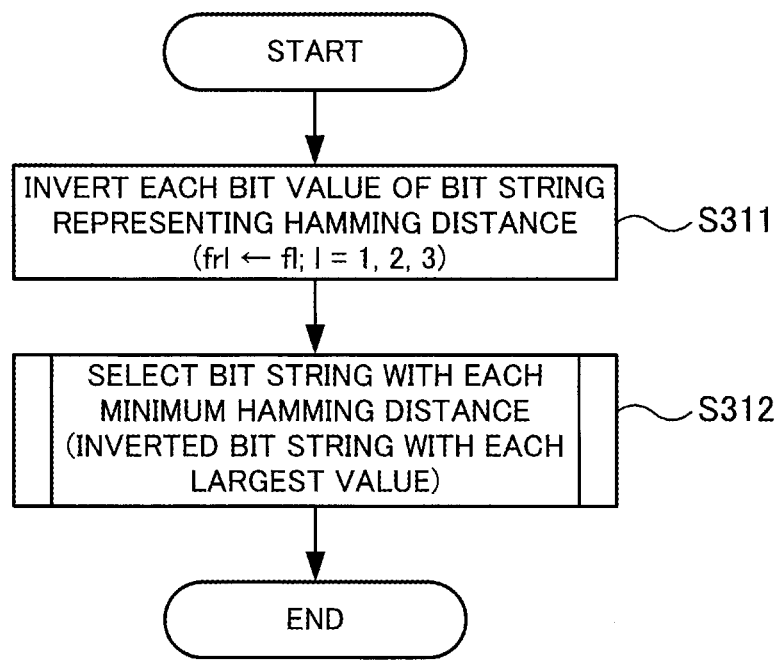
FIG. 21 is a first diagram illustrating a method for selecting each minimum Hamming distance according to the modification of the second embodiment.
Figure 22:
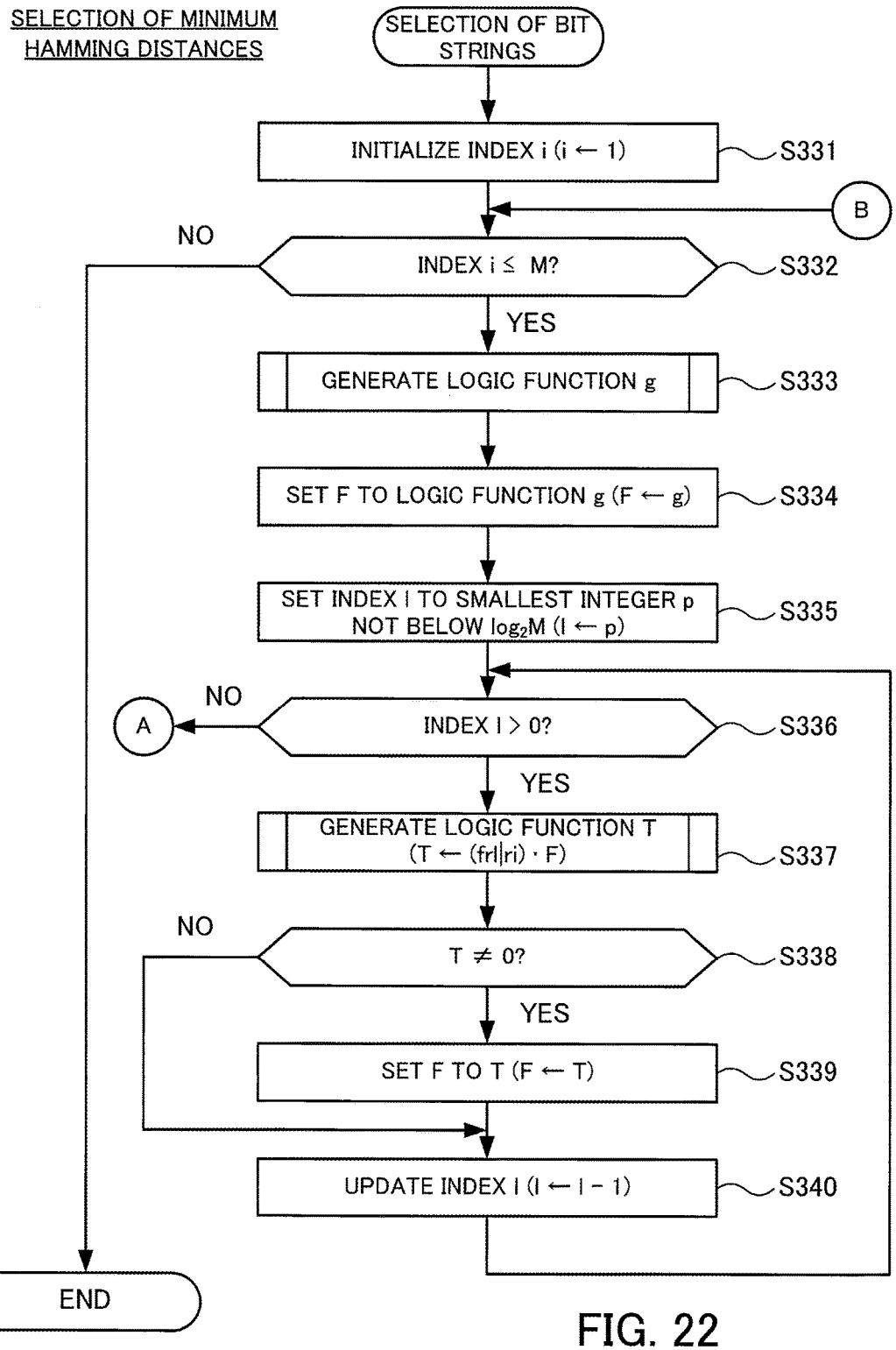
FIG. 22 is a second diagram illustrating the method for selecting each minimum Hamming distance according to the modification of the second embodiment.
Figure 23:
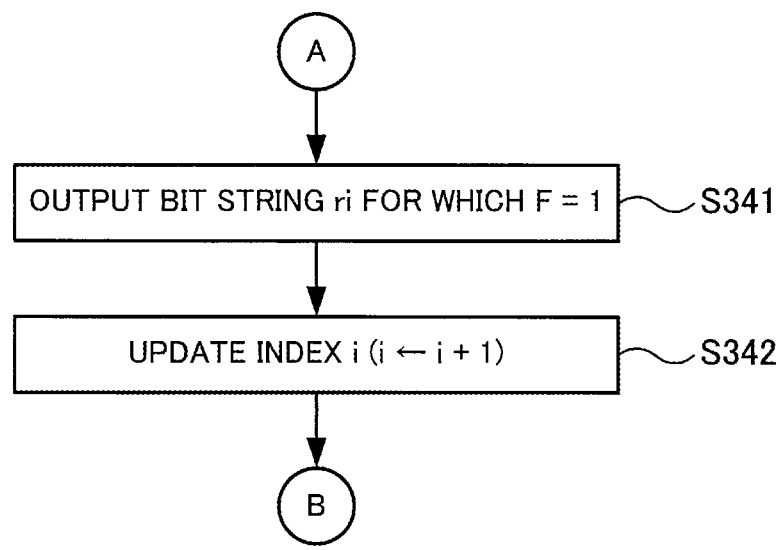
FIG. 23 is a third diagram illustrating the method for selecting each minimum Hamming distance according to the modification of the second embodiment.
Figure 24:
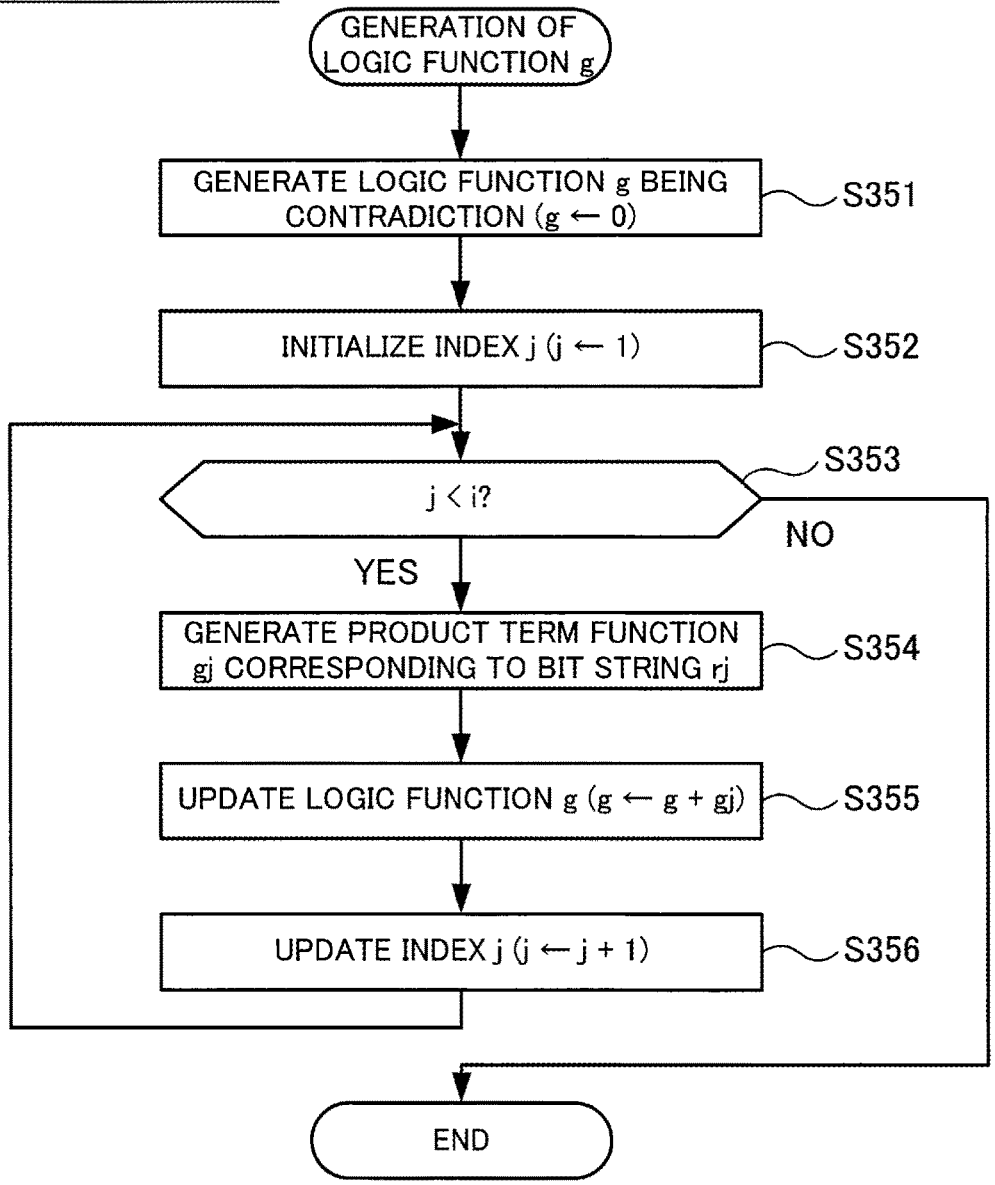
FIG. 24 is a fourth diagram illustrating the method for selecting each minimum Hamming distance according to the modification of the second embodiment.

FIG. 21 is a first diagram illustrating a method for selecting each minimum Hamming distance according to the modification of the second embodiment. FIG. 22 is a second diagram illustrating the method for selecting each minimum Hamming distance according to the modification of the second embodiment. FIG. 23 is a third diagram illustrating the method for selecting each minimum Hamming distance according to the modification of the second embodiment. FIG. 24 is a fourth diagram illustrating the method for selecting each minimum Hamming distance according to the modification of the second embodiment.

Figure 26:
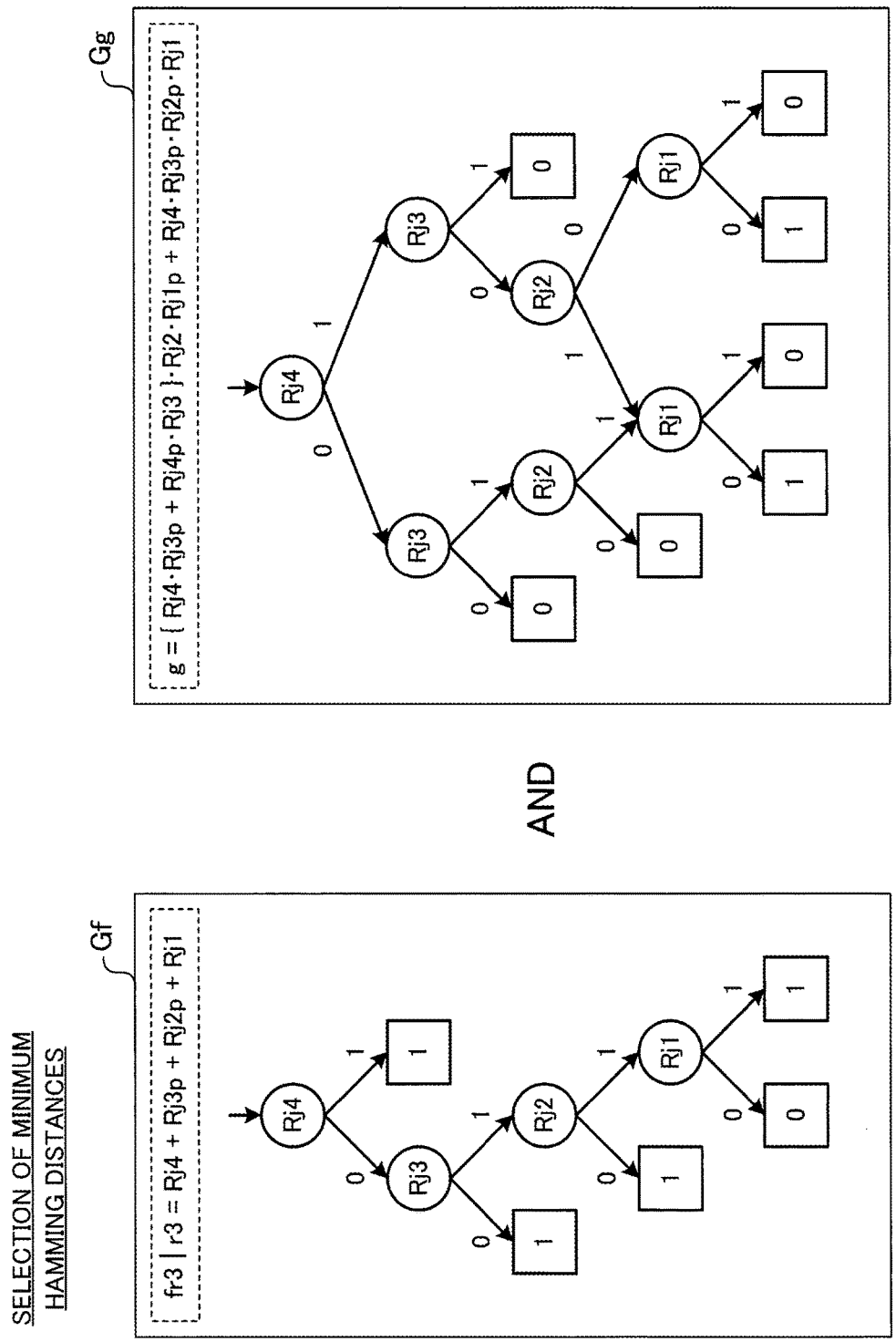
FIG. 26 is a sixth diagram illustrating the method for selecting each minimum Hamming distance according to the modification of the second embodiment.
Figure 27:
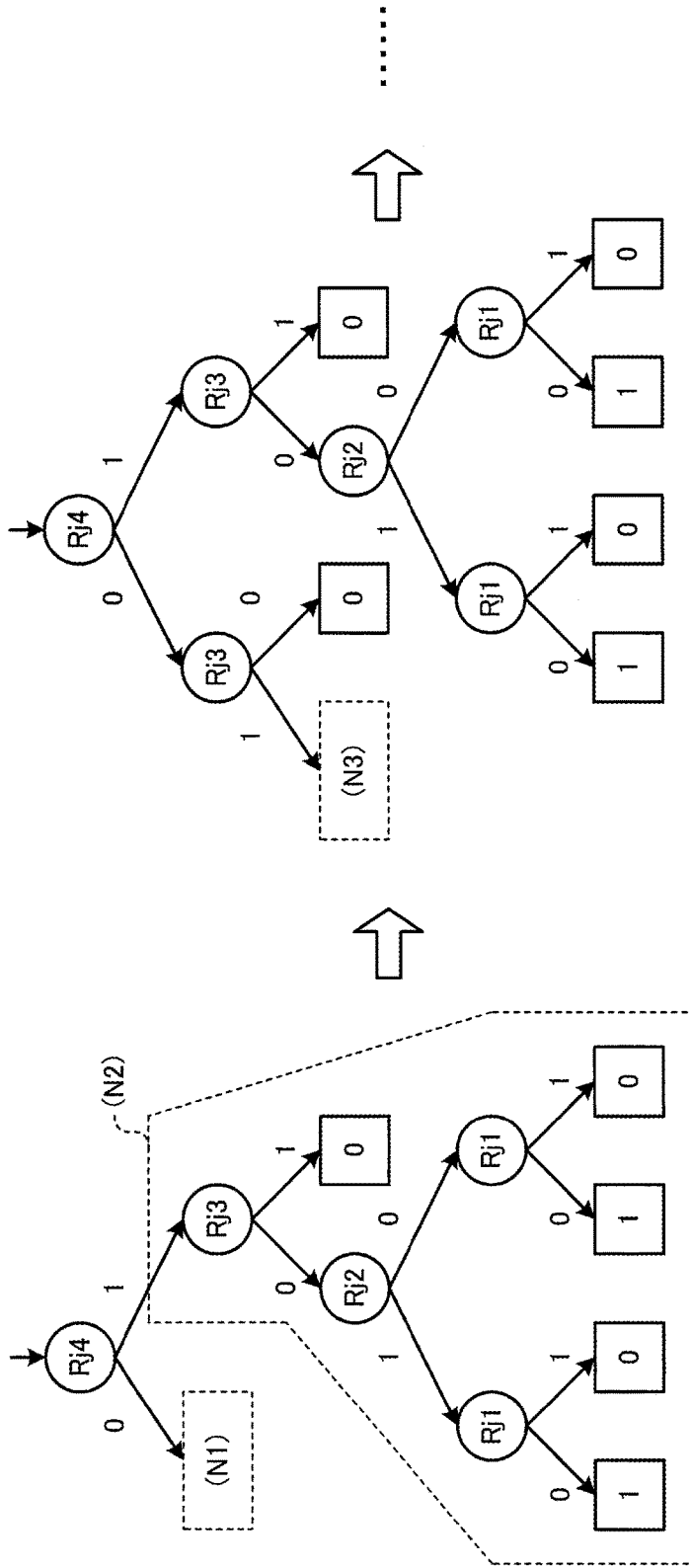
FIG. 27 is a seventh diagram illustrating the method for selecting each minimum Hamming distance according to the modification of the second embodiment.
Figure 28:
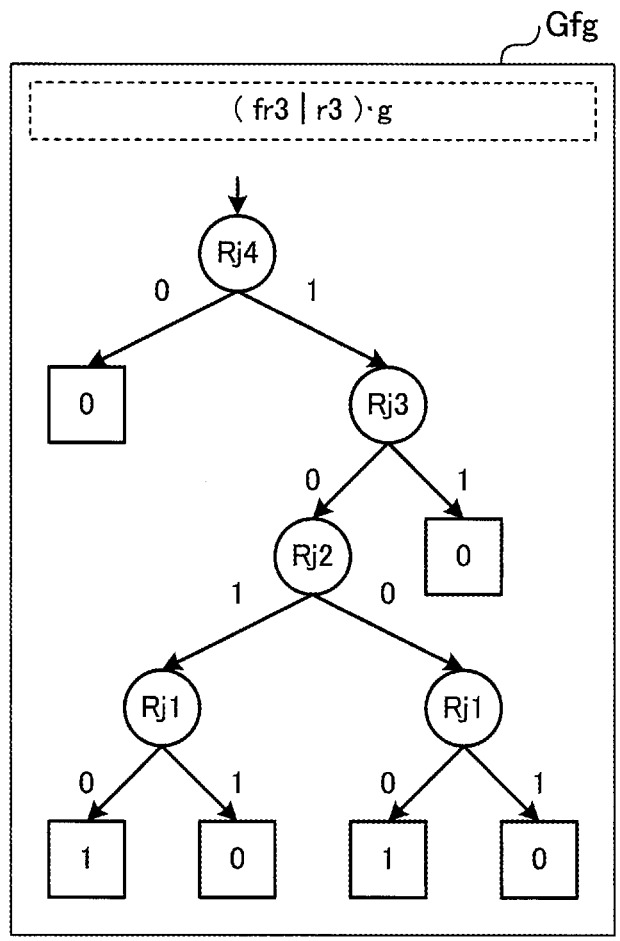
FIG. 28 is an eighth diagram illustrating the method for selecting each minimum Hamming distance according to the modification of the second embodiment.

FIG. 25 is a fifth diagram illustrating the method for selecting each minimum Hamming distance according to the modification of the second embodiment. FIG. 26 is a sixth diagram illustrating the method for selecting each minimum Hamming distance according to the modification of the second embodiment. FIG. 27 is a seventh diagram illustrating the method for selecting each minimum Hamming distance according to the modification of the second embodiment. FIG. 28 is an eighth diagram illustrating the method for selecting each minimum Hamming distance according to the modification of the second embodiment.

The process of selecting a bit string corresponding to each minimum value of the Hamming distances 113 includes steps S311 and S312 of FIG. 21. These steps are executed mainly by the encoding unit 102 of the encoding apparatus 100.

(S311) The encoding unit 102 inverts the bit values of the bit string (f1, f2, f3) representing each of the Hamming distances 113. Specifically, the BDD for calculating the individual bit values f1, f2, and f3 representing each of the Hamming distances 113 is converted to a BDD for performing a NOT operation on each of the bit values f1, f2, and f3. The bit inversions convert the process of selecting the minimum value among the bit strings representing the individual Hamming distances 113 to a process of selecting the maximum value among the inverted values of the bit strings representing the individual Hamming distances 113. Note that the BDD for calculating the inverted values of the bit values f1, f2, and f3 may be prepared in advance. Hereinafter, a bit value obtained by inverting a bit value fl (l=1, 2, and 3) is denoted by frl.

(S312) The encoding unit 102 selects a bit string with each minimum value (i.e., a bit string with each largest value among the inverted bit strings) of the Hamming distances 113. The details of step S312 are described below. After step S312 is completed, a series of processing of FIG. 21 ends.

Step S312 is described further with reference to FIG. 22.

(S331) The encoding unit 102 initializes the index i. Herewith, the index i is set to 1.

(S332) The encoding unit 102 determines whether the index i is equal to or less than the total number of rows M of the encoding matrix 112. If the index i is equal to or less than the total number of rows M, the processing moves to step S333. On the other hand, if the index i is not equal to or less than the total number of rows M, a series of processing of FIG. 22 ends.

(S333 and S334) The encoding unit 102 generates a logic function g. Then, the encoding unit 102 sets a logic function F to the logic function g. The logic function g corresponds to the bit string ri of the index i set in the processing and takes the bit string rj (that is, Rj1, . . . , and Rj4) as its input. The logic function g represents a logical operation for extracting the lower triangular portion of the Hamming distance table, which is the target of the selection process. In addition, the logic function g is represented by a BDD. Note that how to generate the logic function g is described later with reference to FIG. 24.

(S335) The encoding unit 102 selects the smallest integer p not below $\log_2 M$. For example, when M=6, p=3. Then, the encoding unit 102 sets an index l to the integer p. That is, the index l is set to a value indicating a bit located at the end of the bit string representing the Hamming distance.

(S336) The encoding unit 102 determines whether the index l exceeds 0 (l>0). If the index l exceeds 0, the processing moves to step S337. On the other hand, if the index l does not exceed 0 (that is, if the index l becomes 0), the processing moves to step S341 of FIG. 23.

(S337) The encoding unit 102 generates a logic function T. Note that the logic function T is defined as: (frl|ri)·F. In addition, the logic function T is represented by a BDD.

The bit value fl (l=1, 2, and 3) representing the Hamming distance between the bit strings ri and rj is represented by a BDD taking Ri1, . . . , Ri4, Rj1, . . . , and Rj4 as its inputs (see FIG. 16, for example). In addition, the bit value frl is an inversion of the bit value fl.

(frl|ri) represents a BDD associated with Rj1, . . . , and Rj4 obtained when the values of the bit string ri (that is, Ri1, . . . , and Ri4) corresponding to the index i set during the processing are input to the BDD of the bit value frl. In addition, (frl|ri)·F represents a result obtained by performing an AND operation on (frl|ri) and the logic function F. Therefore, the BDD of the logic function T is obtained by combining the BDD of (frl|ri) and the BDD of the logic function F by an AND operation.

The BDD representing the logic function T is used in a process of determining whether, among the bit strings in the row corresponding to the bit value ri (only in the lower triangular portion) of the Hamming distance table, there is a bit string whose bit value frl is 1.

For example, in the case of i=3 and l=3 (the most significant bit), the logic function F has been set to the logic function g which represents the lower triangular portion of the Hamming distance table. Therefore, the logic function T is represented by a BDD for outputting the bit value fr3 of the individual bit strings in the row corresponding to the bit string r3 (only in the lower triangular portion) of the Hamming distance table.

If, in the row corresponding to the bit string r3, there is no bit string with the bit value fr3 being 1, the logic function T is a contradiction (i.e., all leaf nodes being 0). On the other hand, if there is a bit string with the bit value fr3 being 1 in the row corresponding to the bit string r3, the logic function T is represented by a BDD having a leaf node with a value of 1 (the logic function T is not a contradiction).

In addition, when the logic function T is not a contradiction, the logic function F is updated, as described later. For example, when there is a bit string with the bit value fr3 being 1 in the row corresponding to the bit string r3, the logic function F is updated to a logic function representing the bit string with the bit value fr3 being 1 in the row corresponding to the bit string r3 in the lower triangular portion of the Hamming distance table.

In this case, the logic function T is represented by a BDD for outputting the bit value fr2 of the bit string with the bit value fr3 being 1 amongst the bit strings in the row corresponding to the bit string r3 (only in the lower triangular portion) of the Hamming distance table. Thus, the BDD representing the logic function T is used in a process of extracting a bit string with a higher-order bit value fr1 being 1.

Note that how to generate the logic function T based on BDDs is described later with reference to FIGS. 25 to 28. After step S337 is completed, the processing moves to step S338.

(S338) The encoding unit 102 determines whether the logic function T is not a contradiction (T≠0). If the logic function T is not a contradiction (T≠0), the processing moves to step S339. On the other hand, if the logic function T is a contradiction (T=0), the processing moves to step S340. That is, when the logic function T is a contradiction (T=0), step S339 for updating the logic function F is skipped.

(S339) The encoding unit 102 sets the logic function F to the logic function T. By setting the logic function F to the logic function T, the condition represented by the current logic function T is added when the logic function T is generated in the next round of step S337.

(S340) The encoding unit 102 updates the index 1 to its value decreased by 1. After S340 is completed, the processing moves to step S336 of FIG. 22.

(S341) The encoding unit 102 outputs the bit string rj for which the logic function F returns a value of 1. The logic function F represents a condition for extracting a combination of bit values in which a higher-order bit value amongst the bit values fr1 (l=1, 2, and 3) is 1. That is, the logic function F is a logical operation for extracting, from the row corresponding to the bit string ri in the Hamming distance table, the maximum value among the values each represented by the bit values fr1 (l=1, 2, and 3). Therefore, the bit string rj corresponding to the bit values fr1 (l=1, 2, and 3) for which the logic function F returns True (i.e., 1) has the minimum Hamming distance to the bit string ri.

Note that the logic function F is represented by a BDD taking the bit string rj (that is, Rj1, . . . , and Rj4) as its input. By searching for Rj1, . . . , and Rj4 based on which a leaf node being 1 in the BDD is reached, the bit string rj for which the logic function F returns 1 is obtained.

(S342) The encoding unit 102 updates the index i to its value increased by 1. After step S342 is completed, the processing moves to step S332 of FIG. 22.

According to the above-described processing, with respect to each bit string ri, the bit string rj having the minimum Hamming distance to the bit string ri is obtained.

(Method for Generating Logic Function g)

Now the method for generating the logic function g is described with reference to FIG. 24. The logic function g is a logical operation representing a condition for limiting operation targets to those in the lower triangular portion of the Hamming distance table (that is, a logical operation for masking the upper triangular portion).

(S351) The encoding unit 102 generates the logic function g being a contradiction.

(S352) The encoding unit 102 initializes the index j to 1.

(S353) The encoding unit 102 determines whether the index j is less than i (j<i). If the index j is less than i, the processing moves to step S354. On the other hand, if the index j is not less than i, a series of processing illustrated in FIG. 24 ends.

(S354) The encoding unit 102 generates a product term function gj corresponding to the bit string rj. For example, in the case of rj being 1010, the function gj taking Rj1, Rj2, Rj3, and Rj4 as its inputs performs AND operations sequentially on Rj4, Rrj3, Rj2, and Rrj1 (gj=Rj4·Rrj3·Rj2·Rrj1). Note that Rrjk (k=1 to 4) is an inversion of the bit value Rjk. That is, the function gj performs AND operations on a combination of input bit values in which bits each corresponding, in the bit string rj, to a bit location with the bit value being 0 have been inverted.

(S355 and S356) The encoding unit 102 updates the logic function g to (g+gj). Then, the encoding unit 102 updates the index j to its value increased by 1. After steps S355 and S356 are completed, the processing moves to step S353.

(Method for Generating Logic Function T)

Now the method for generating the logic function T based on BDDs is described with reference to FIGS. 25 to 28. The method is explained here with an example where the index i is 3. Note that values in the Hamming distance table illustrated in FIG. 25 are those obtained after the bit value inversion and the diagonal element replacement (post-processing).

When the index i (i-th row) is 3, ri is 1001 (r3) as illustrated in FIG. 25. Therefore, Ri1=1, Ri2=0, Ri3=0, and Ri4=1. Then, if the index j (j-th row) is 1, the bit values fr1, fr2, and fr3 are 1, 0, and 1, respectively. Similarly, if the index j (j-th row) is 2, the bit values fr1, fr2, and fr3 are 0, 1, and 1, respectively. If the index j (j-th row) is 3, the bit values fr1, fr2, and fr3 are 1, 0, and 1, respectively.

According to the processing flow of FIG. 24, the logic function g corresponding to the bit string r3 is expressed in the following Equation (1). Note that the symbol · represents an AND operation while the symbol + represents an OR operation. In addition, fr3 is expressed in the following Equation (2). Therefore, (fr3|r3) is expressed in the following Equation (3). Based on Equations (1) and (3), the logic function T (T=(fr3|r3)·F) is written as the following Equation (4).

$$g(Rj1,Rj2,Rj3,Rj4)=(Rj4 \cdot Rrj3+Rrj4 \cdot Rj3) \cdot Rj2 \cdot Rrj1+ Rj4 \cdot Rrj3 \cdot Rrj2 \cdot Rj1 \quad (1)$$

$$fr3(Ri1,Ri2,Ri3,Ri4,Rj1,Rj2,Rj3,Rj4)=Ri2+Rj4+Rrj3+ Rri4 \cdot Rj2+Ri4 \cdot Rj1+Rri4 \cdot Rrj1 \quad (2)$$

$$(fr3|r3)=Rj4+Rrj3+Rrj2+Rj1 \quad (3)$$

$$T=Rj4 \cdot Rrj3 \cdot Rj2 \cdot Rrj1+Rj4 \cdot Rrj3 \cdot Rrj2 \cdot Rj1 \quad (4)$$

(fr3|r3) in Equation (3) above is represented by a BDD Gf illustrated in FIG. 26. In addition, the logic function g of Equation (1) above is represented by a BDD Gg illustrated in FIG. 26. In step S337 above, the encoding unit 102 creates a BDD Gfg representing the logic function T by performing an AND operation on the BDDs Gf and Gg, as illustrated in FIG. 26. The BDD Gfg is created by a procedure illustrated in FIG. 27. Note that compression of the BDD is partially omitted in order to avoid complication of the drawing.

FIG. 27 illustrates the BDD Gfg. First, conditional branching associated with Rj4 is considered. In the case of Rj4=1, (fr3|r3) always returns 1 (see the BDD Gf of FIG. 26). Therefore, within the BDD Gfg, the part (N2) located at the end of the branch corresponding to Rj4=1 has the same configuration as, within the BDD Gg, a BDD located at the end of the branch corresponding to Rj4=1.

On the other hand, as for the part (N1) located at the end of the branch corresponding to Rj4=0 within the BDD Gfg, conditional branching associated with Rj3 is examined. In the case of Rj4=0 and Rj3=0, g always returns 0 (see the BDD Gg of FIG. 26). Therefore, in the BDD Gfg, a leaf node representing a bit value of 0 is located at the end of the branch corresponding to the case of Rj4=0 and Rj3=0. On the other hand, as for the part (N3) located at the end of the branch corresponding to Rj4=0 and Rj3=1 within the BDD Gfg, conditional branching associated with Rj2 is examined.

As illustrated above, the content of each conditional branching is sequentially examined until a leaf node is reached, and the configuration of the BDD Gfg is thus built up. Repetition of the above-described processing eventually results in the BDD Gfg illustrated in FIG. 28. Note that compression of the BDD is partially omitted for the purpose of illustration; however, it is preferable in practice that the configuration of the BDD Gfg be built up in such a manner as not to create shared nodes and redundant nodes.

As has been described above, application of BDD representations enables more efficient operation processing. For example, the BDD of the bit values f1 (1=1, 2, . . . ) representing the Hamming distances needs to be created only once before performing the operation for searching for the minimum Hamming distance. In addition, the number of operations of each of the logic functions (mainly, g and T) represented by a BDD remains unchanged regardless of the number of columns in the Hamming distance table. This is the advantage compared to the case of calculating the Hamming distances as many as the number obtained by multiplying the number of rows by the number of columns of the Hamming distance table (or as many as the number corresponding to the lower triangular portion of the Hamming distance table). Therefore, the use of BDD representations enables efficient searches for bit strings having the minimum Hamming distances. Then, the use of compressed BDDs further reduces the load of the search processing.

The modification of the second embodiment has been described thus far.

As has been described above, according to the embodiments discussed herein, it is possible to reduce operation load associated with encoding.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. An encoding method comprising:
   acquiring, by a processor, a plurality of data segments which are created by dividing transmission data, and encoding information indicating a plurality of encoding patterns from a memory, wherein each of the plurality of encoding patterns represents a set of data segments in the plurality of data segments, and the set of data segments is used for a predetermined encoding calculation; and
   generating, by the processor, with respect to each of the plurality of encoding patterns included in the encoding information, an encoded data piece by performing the predetermined encoding calculation on at least one data segment among the plurality of data segments based on said each of the plurality of encoding patterns, and storing the encoded data piece in the memory;
   wherein the generating includes
      comparing a first encoding pattern used for generating the encoded data piece in the memory to a second encoding pattern which indicates at least one data segment used for a next encoding calculation, and
      performing the next encoding calculation by using the encoded data piece corresponding to the first encoding pattern in the memory, when at least a part of the second encoding pattern is common with the first encoding pattern, and
   wherein the generating further includes
      acquiring first information representing a first binary decision diagram which indicates a logical calculation for calculating a degree of dissimilarity between each selectable pair of encoding patterns from the plurality of encoding patterns, and second information representing a second binary decision diagram which indicates a logical calculation for selecting, based on the first binary decision diagram, an encoding pattern with a lamest common part as the first encoding pattern among at least one encoding pattern having a common part with the second encoding pattern, from the memory, and
      performing the next encoding calculation based on the second binary decision diagram.

2. An encoding apparatus comprising:
   a memory configured to store a plurality of data segments which are created by dividing transmission data, and encoding information indicating a plurality of encoding patterns, wherein each of the plurality of encoding patterns represents a set of data segments in the plurality of data segments, and the set of data segments is used for a predetermined encoding calculation; and
   a processor configured to perform a procedure including generating, with respect to each of the plurality of encoding patterns included in the encoding information, an encoded data piece by performing the predetermined encoding calculation on at least one data segment among the plurality of data segments based on said each of the plurality of encoding patterns, and storing the encoded data piece in the memory,
   wherein the generating includes
      comparing a first encoding pattern used for generating the encoded data piece in the memory to a second encoding pattern which indicates at least one data segment used for a next encoding calculation, and
      performing the next encoding calculation by using the encoded data piece corresponding to the first encoding pattern in the memory, when at least a part of the second encoding pattern is common with the first encoding pattern, and
   wherein the generating further includes
      acquiring first information representing a first binary decision diagram which indicates a logical calculation for calculating a degree of dissimilarity between each selectable pair of encoding patterns from the plurality of encoding patterns, and second information representing a second binary decision diagram which indicates a logical calculation for selecting, based on the first binary decision diagram, an encoding pattern with a lamest common part as the first encoding pattern among at least one encoding pattern having a common part with the second encoding pattern, from the memory, and
      performing the next encoding calculation based on the second binary decision diagram.

3. A non-transitory computer-readable storage medium storing a computer program that causes a computer having a processor and a memory, to perform a procedure comprising:

acquiring, by the processor, a plurality of data segments which are created by dividing transmission data, and encoding information indicating a plurality of encoding patterns from the memory, wherein each of the plurality of encoding patterns represents a set of data segments in the plurality of data segments, and the set of data segments is used for a predetermined encoding calculation; and generating, by the processor, with respect to each of the plurality of encoding patterns included in the encoding information, an encoded data piece by performing the predetermined encoding calculation on at least one data segment among the plurality of data segments based on said each of the plurality of encoding patterns, and storing the encoded data piece in the memory;

wherein the generating includes comparing a first encoding pattern used for generating the encoded data piece in the memory to a second encoding pattern which indicates at least one data segment used for a next encoding calculation, and performing the next encoding calculation by using the encoded data piece corresponding to the first encoding pattern in the memory, when at least a part of the second encoding pattern is common with the first encoding pattern, and wherein the generating further includes acquiring first information representing a first binary decision diagram which indicates a logical calculation for calculating a degree of dissimilarity between each selectable pair of encoding patterns from the plurality of encoding patterns, and second information representing a second binary decision diagram which indicates a logical calculation for selecting, based on the first binary decision diagram, an encoding pattern with a lamest common part as the first encoding pattern among at least one encoding pattern having a common part with the second encoding pattern, from the memory, and performing the next encoding calculation based on the second binary decision diagram.

\* \* \* \* \*